(12) United States Patent
Wu et al.

(10) Patent No.: US 10,575,229 B2
(45) Date of Patent: Feb. 25, 2020

(54) METHOD AND APPARATUS FOR MULTIPLEXING HYBRID SATELLITE CONSTELLATIONS

(71) Applicant: QUALCOMM Incorporated, San Diego, CA (US)

(72) Inventors: Qiang Wu, San Diego, CA (US); Peter John Black, La Jolla, CA (US); Ruoheng Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 93 days.

(21) Appl. No.: 16/012,639

(22) Filed: Jun. 19, 2018

(65) Prior Publication Data

US 2018/0376393 A1    Dec. 27, 2018

Related U.S. Application Data

(60) Provisional application No. 62/523,250, filed on Jun. 21, 2017.

(51) Int. Cl.
*H04W 36/08*     (2009.01)
*H04B 7/185*     (2006.01)
(Continued)

(52) U.S. Cl.
CPC ....... *H04W 36/08* (2013.01); *H03M 13/2966* (2013.01); *H04B 7/18504* (2013.01); *H04B 7/18519* (2013.01); *H04B 7/18521* (2013.01); *H04J 3/00* (2013.01); *H04L 1/0057* (2013.01); *H04L 5/1469* (2013.01); *H04L 5/26* (2013.01);
(Continued)

(58) Field of Classification Search
CPC ............. H04W 36/08; H04W 36/0055; H04W 36/165; H04W 36/18; H04W 36/36; H04W 72/0446; H04W 84/06; H03M 13/2966; H04B 7/18504; H04B 7/19; H04B 7/21; H04B 7/195; H04J 3/00; H04L 1/0057; H04L 1/1469; H04L 1/26
See application file for complete search history.

(56) References Cited

U.S. PATENT DOCUMENTS

| | | | | |
|---|---|---|---|---|
| 4,004,098 | A | * | 1/1977 | Shimasaki ........... H04B 7/2045 370/325 |
| 5,448,623 | A | * | 9/1995 | Wiedeman ......... H04B 7/18556 455/12.1 |

(Continued)

OTHER PUBLICATIONS

International Search Report and Written Opinion—PCT/US2018/038471—ISA/EPO—Sep. 20, 2018.

*Primary Examiner* — Jenee Holland
(74) *Attorney, Agent, or Firm* — Paradice and Li LLP

(57) ABSTRACT

A method and apparatus for operating a satellite system including different satellites that may belong to different types of satellite constellations. In some implementations, the satellite system may include a LEO satellite constellation and one or more non-LEO satellite constellations that can be used to increase the forward link capacity of the LEO satellite constellation, for example, by allowing an LEO satellite to offload at least some of its forward link traffic to one of the non-LEO satellites. The user terminals can dynamically switch forward link communications between a LEO satellite and a non-LEO satellite while maintaining a return link connection with the LEO satellite.

30 Claims, 14 Drawing Sheets

(51) Int. Cl.
| | | |
|---|---|---|
| *H04W 36/18* | (2009.01) | |
| *H04W 36/36* | (2009.01) | |
| *H04W 36/16* | (2009.01) | |
| *H04W 72/04* | (2009.01) | |
| *H04B 7/195* | (2006.01) | |
| *H04B 7/19* | (2006.01) | |
| *H04J 3/00* | (2006.01) | |
| *H04L 5/14* | (2006.01) | |
| *H03M 13/29* | (2006.01) | |
| *H04L 1/00* | (2006.01) | |
| *H04L 5/26* | (2006.01) | |
| *H04W 36/00* | (2009.01) | |
| *H04W 84/06* | (2009.01) | |
| *H03M 13/15* | (2006.01) | |

(52) U.S. Cl.
CPC ..... *H04W 36/0055* (2013.01); *H04W 36/165* (2013.01); *H04W 36/18* (2013.01); *H04W 36/36* (2013.01); *H04W 72/0446* (2013.01); *H03M 13/152* (2013.01); *H04B 7/19* (2013.01); *H04B 7/195* (2013.01); *H04W 84/06* (2013.01)

(56) References Cited

U.S. PATENT DOCUMENTS

| | | | | |
|---|---|---|---|---|
| 5,586,165 A | * | 12/1996 | Wiedeman | H04B 7/18556 455/427 |
| 5,752,187 A | * | 5/1998 | Frank | H04B 7/18541 370/316 |
| 5,918,157 A | * | 6/1999 | Wiedeman | H04B 7/18539 370/316 |
| 6,392,593 B1 | * | 5/2002 | Pemble | G01S 19/28 342/357.67 |
| 7,092,725 B2 | * | 8/2006 | Anderson | H04B 7/1855 455/12.1 |
| 2003/0043761 A1 | * | 3/2003 | Hladik | H04B 7/212 370/319 |
| 2004/0090935 A1 | * | 5/2004 | Courtney | H04W 36/12 370/331 |
| 2004/0092263 A1 | * | 5/2004 | Parkman | H04B 7/18508 455/436 |
| 2006/0040612 A1 | * | 2/2006 | Min | H04B 7/18508 455/12.1 |
| 2007/0123252 A1 | * | 5/2007 | Tronc | H04B 7/18563 455/427 |
| 2007/0155318 A1 | * | 7/2007 | Monte | H04B 7/195 455/12.1 |
| 2010/0035604 A1 | * | 2/2010 | Dutta | H04B 7/18513 455/427 |
| 2010/0182947 A1 | * | 7/2010 | Jong | H04B 7/18513 370/316 |
| 2015/0373706 A1 | * | 12/2015 | Monte | H04B 7/2041 370/321 |
| 2016/0323800 A1 | * | 11/2016 | Ulupinar | H04W 36/38 |
| 2017/0005741 A1 | * | 1/2017 | Wu | H04B 7/2041 |
| 2017/0041830 A1 | * | 2/2017 | Davis | H04W 36/0005 |
| 2017/0099120 A1 | | 4/2017 | Damnjanovic et al. | |
| 2017/0105153 A1 | | 4/2017 | Ashrafi et al. | |
| 2017/0111912 A1 | | 4/2017 | Keshet | |
| 2017/0374596 A1 | * | 12/2017 | Benammar | H04W 36/30 |
| 2018/0376392 A1 | | 12/2018 | Wu et al. | |

\* cited by examiner

METHOD AND APPARATUS FOR MULTIPLEXING HYBRID SATELLITE CONSTELLATIONS

CROSS-REFERENCE TO RELATED APPLICATION

This Patent Application claims priority under 35 U.S.C. 119(e) to commonly-owned U.S. Provisional Patent Application No. 62/523,250 entitled "Method and Apparatus for Multiplexing Hybrid Satellite Constellations" filed on Jun. 21, 2017, the entirety of which is incorporated by reference herein.

INTRODUCTION

Various aspects described herein relate to satellite communications, and more particularly to improving the reception of weak signals transmitted from ground-based devices.

Conventional satellite-based communication systems include gateways and one or more satellites to relay communication signals between the gateways and one or more user terminals. A gateway is an earth station having an antenna for transmitting signals to, and receiving signals from, communication satellites. A gateway provides communication links, using satellites, for connecting a user terminal to other user terminals or users of other communication systems, such as a public switched telephone network, the internet and various public and/or private networks. A satellite is an orbiting receiver and repeater used to relay information.

A satellite can receive signals from and transmit signals to a user terminal provided the user terminal is within the "footprint" of the satellite. The footprint of a satellite is the geographic region on the surface of the Earth within the range of signals of the satellite. The footprint is usually geographically divided into "beams," through the use of one or more antennas. Each beam covers a particular geographic region within the footprint. Beams may be directed so that more than one beam from the same satellite covers the same specific geographic region.

Geosynchronous satellites have long been used for communications. A geosynchronous satellite is stationary relative to a given location on the Earth, and thus there is little timing shift and frequency shift in radio signal propagation between a communication transceiver on the Earth and the geosynchronous satellite. However, because geosynchronous satellites are limited to a geosynchronous orbit (GSO), the number of satellites that may be placed in the GSO is limited. As alternatives to geosynchronous satellites, communication systems which utilize a constellation of satellites in non-geosynchronous orbits (NGSO), such as low-earth orbits (LEO) and medium-earth orbits (MEO), have been devised to provide communication coverage to the entire Earth or at least large parts of the Earth.

A constellation of NGSO satellites may provide coverage for greater portions of Earth than a constellation of GSO satellites, for example, because the orbital planes of NGSO satellites are not limited to geosynchronous orbits. LEO satellites typically employ orbits between approximately 160 km and 2,000 km above the surface of the Earth, and MEO satellites typically employ orbits between approximately 2,000 km and 35,000 km above the surface of the Earth. MEO satellites are visible to observers on Earth for much longer periods of time than LEO satellites, and typically have a larger coverage area (such as a wider footprint) on Earth than LEO satellites. The longer durations of visibility and wider footprints of MEO satellites means that fewer satellites are needed in an MEO constellation than in an LEO constellation to provide similar coverage on Earth. However, because MEO satellites orbit the Earth at much greater altitudes than LEO satellites, MEO satellites have much longer signal propagation delays than LEO satellites, and may require greater transmission power levels than LEO satellites.

GSO satellites typically employ larger antennas than LEO satellites, and may therefore offer greater bandwidth and better signal-to-noise ratios (SNRs) than LEO satellites. MEO satellites also may employ larger antennas than LEO satellites, and therefore also may offer greater bandwidth and SNRs than LEO satellites. However, LEO satellites are typically less complex, less expensive, and easier to put into orbit that MEO satellites and GSO satellites.

It may be desirable for a satellite system to include multiple types of satellite constellations, for example, to leverage the advantages of different types of satellite constellations. Integrating multiple types of satellite constellations into a single satellite system that offers uninterrupted service while ensuring user satisfaction can be challenging. These challenges may be compounded when user terminals configured for communications with one type of satellite constellation are to be deployed in a satellite system which includes different types of satellite constellations.

SUMMARY

The systems, methods and devices of this disclosure each have several innovative aspects, no single one of which is solely responsible for the desirable attributes disclosed herein.

One innovative aspect of the subject matter described in this disclosure can be implemented as a method for switching forward link communications of a user terminal between a first satellite and a second satellite. The first and second satellites can be different types of satellites, and can belong to different satellite constellations. In some aspects, the first satellite is a low-earth orbit (LEO) satellite, and the second satellite is one of a medium-earth orbit (MEO) satellite or a geosynchronous orbit (GSO) satellite. In other aspects, the first satellite is a first LEO satellite, and the second satellite is a second LEO satellite. The method can be performed by a user terminal, and can include receiving first data on a forward link of the first satellite, and receiving time-division multiplexing (TDM) configuration information on the forward link of the first satellite, the TDM configuration information specifying a TDM transmission pattern for forward link communications to the user terminal from at least the first and second satellites.

The method can also include switching forward link communications of the user terminal from the first satellite to the second satellite during a handover operation, receiving second data on a forward link of the second satellite after the handover operation and transmitting one or more control or data messages to a network controller on a return link of the first satellite after the handover operation. In some implementations, the one or more control or data messages can include an acknowledgement of the second data received by the user terminal. In addition, or in the alternative, the one or more control or data messages can include information pertaining to the handover operation from the first satellite to the second satellite.

In some implementations, switching the forward link communications from the first satellite to the second satellite can be triggered by a radio controller circuit (RRC) message transmitted to the user terminal using the forward link of the first satellite. In some aspects, the second data can be transmitted using a concatenated code including a turbo code as an inner code and including a Bose-Chaudhuri-Hocquenghem (BCH) code as an outer code.

Another innovative aspect of the subject matter described in this disclosure can be implemented in a user terminal to switch its forward link communications between first and second satellites. In some implementations, the user terminal can include one or more processors and a memory. The memory can store instructions that, when executed by the one or more processors, cause the user terminal to receive first data on a forward link of the first satellite; receive time-division multiplexing (TDM) configuration information on the forward link of the first satellite, the TDM configuration information specifying a TDM transmission pattern for forward link communications to the user terminal from at least the first and second satellites; switch forward link communications of the user terminal from the first satellite to the second satellite during a handover operation; receive second data on a forward link of the second satellite after the handover operation; and transmit one or more control or data messages to a network controller on a return link of the first satellite after the handover operation.

Another innovative aspect of the subject matter described in this disclosure can be implemented in a non-transitory computer-readable medium. The non-transitory computer-readable medium can store instructions that, when executed by one or more processors of a user terminal, cause the user terminal to switch its forward link communications terminal between first and second satellites by performing a number of operations. In some implementations, the number of operations can include receiving first data on a forward link of the first satellite; receiving time-division multiplexing (TDM) configuration information on the forward link of the first satellite, the TDM configuration information specifying a TDM transmission pattern for forward link communications to the user terminal from at least the first and second satellites; switching forward link communications of the user terminal from the first satellite to the second satellite during a handover operation; receiving second data on a forward link of the second satellite after the handover operation; and transmitting one or more control or data messages to a network controller on a return link of the first satellite after the handover operation.

Another innovative aspect of the subject matter described in this disclosure can be implemented in an apparatus to switch its forward link communications between first and second satellites. In some implementations, the apparatus can include means for receiving first data on a forward link of the first satellite; means for receiving time-division multiplexing (TDM) configuration information on the forward link of the first satellite, the TDM configuration information specifying a TDM transmission pattern for forward link communications to the user terminal from at least the first and second satellites; means for switching forward link communications of the user terminal from the first satellite to the second satellite during a handover operation; means for receiving second data on a forward link of the second satellite after the handover operation; and means for transmitting one or more control or data messages to a network controller on a return link of the first satellite after the handover operation.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

Aspects of this disclosure are illustrated by way of example and are not intended to be limited by the figures of the accompanying drawings.

Like reference numerals refer to corresponding parts throughout the drawing figures.

DETAILED DESCRIPTION

Figure 1:
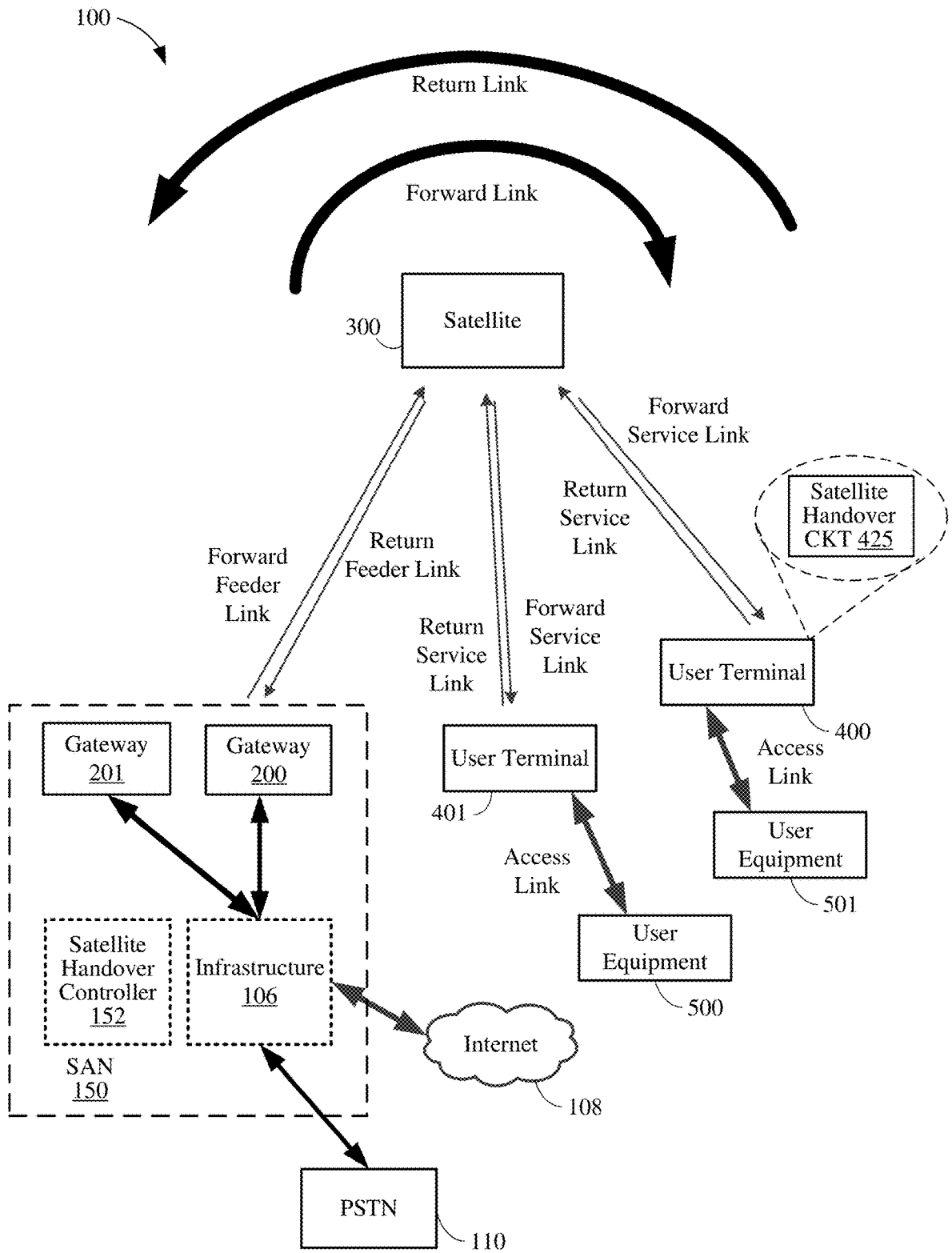
FIG. 1 shows a block diagram of an example communication system.

The example implementations described herein may allow a user terminal to transmit and receive data using a satellite system including different types of satellites that may belong to different types of satellite constellations. In some implementations, the satellite system may include a constellation of LEO satellites and one or more non-LEO satellite constellations. The one or more non-LEO satellite constellations may be used to increase the forward link capacity of the LEO satellite constellation, for example, by allowing an LEO satellite to offload at least some of its forward link traffic to one of the non-LEO satellites. In some aspects, the non-LEO satellites may not provide return link resources for user terminals to request data re-transmissions, to send channel quality information (CQI) to a satellite controller, and to report data reception errors. Thus, in accordance with aspects of the present disclosure, the user terminals may dynamically switch forward link communications between a LEO satellite and a non-LEO satellite (or between two different non-LEO satellites) while maintaining a return link connection with the LEO satellite. In some aspects, the user terminal includes a single antenna and is configured to dynamically switch communications between different types of satellites (such as between LEO satellites, MEO satellites, and GSO satellites) using time-division multiplexing (TDM)-based transmission patterns. In this manner, forward link resources of the satellite system may be dynamically switched between different satellites to increase overall data throughput of the satellite system while allowing the user terminals to use the return link resources of the LEO satellite to request data re-transmissions, to send channel quality information to the satellite controller, to report data reception errors to the satellite controller, and to send other information (such as control data, user data, acknowledgements, HTTP get, hybrid automatic repeat requests (HARQs), channel quality information (CQI) reports, configuration information, and so on) to the satellite controller.

Aspects of the disclosure are described in the following description and related drawings directed to specific examples. Alternate examples may be devised without departing from the scope of the disclosure. Additionally, well-known elements will not be described in detail or will be omitted so as not to obscure the relevant details of the disclosure.

As used herein, the terms "ephemeris" and "ephemeris data" refer to satellite orbital information that contains positions of one or more satellites for a number of given times (e.g., in the future). A satellite's position may be expressed using a 3-dimensional coordinate system such as a spherical coordinate system. For example, in a spherical coordinate system, a satellite's position relative to a fixed point on Earth may be represented as a line extending from the fixed point on Earth to the satellite. The line may be expressed as a vector including three numbers: the radial distance of the satellite from the fixed point, the elevation angle, and the azimuth (or azimuth angle). The elevation angle, which may also be referred to as the inclination angle or the polar angle, is the angle between the line and a reference plane parallel to the surface of the Earth. Thus, as used herein, the terms "elevation angle," "inclination angle," and "polar angle" may be interchangeable. The reference plane may be referred to herein as the "azimuth plane," and thus the terms "reference plane" and "azimuth plane" may be interchangeable. The azimuth is the angle between a reference direction and the orthogonal projection of the line onto the azimuth plane. For purposes of discussion herein, the reference direction may correspond to the direction of true North, and may hereinafter be referred to as the reference azimuth. Thus, as used herein, the terms "reference azimuth" and "reference direction" may be interchangeable, and for at some implementations may refer to a direction of true North.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Further, many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present disclosure. However, it will be apparent to one skilled in the art that these specific details may not be required to practice the various aspects of the present disclosure. In other instances, well-known circuits and devices are shown in block diagram form to avoid obscuring the present disclosure. The various aspects of the present disclosure are not to be construed as limited to specific examples described herein but rather to include within their scopes all implementations defined by the appended claims.

FIG. 1 illustrates an example of a satellite communication system 100 which includes a plurality of satellites (although only one satellite 300 is shown for simplicity) in a number of non-geosynchronous orbits, for example, low-earth orbits (LEO) and medium-earth orbits (MEO), a satellite access network (SAN) 150 in communication with the satellite 300, a plurality of user terminals (UTs) 400 and 401 in communication with the satellite 300, and a plurality of user equipment (UE) 500 and 501 in communication with the UTs 400 and 401, respectively. Each UE 500 or 501 may be a user device such as a mobile device, a telephone, a smartphone, a tablet, a laptop computer, a computer, a wearable device, a smart watch, an audiovisual device, or any device including the capability to communicate with a UT. Additionally, the UE 500 and/or UE 501 may be a device (e.g., access point, small cell, etc.) that is used to communicate to one or more end user devices. In the example illustrated in FIG. 1, the UT 400 and the UE 500 communicate with each other via a bidirectional access link (having a forward access link and return access link), and similarly, the UT 401 and the UE 501 communicate with each other via another bidirectional access link. In another implementation, one or more additional UEs (not shown) may be configured to receive only and therefore communicate with a UT only using a forward access link. In another implementation, one or more additional UEs (not shown) may also communicate with UT 400 or UT 401. Alternatively, a UT and a corresponding UE may be integral parts of a single physical device, such as a mobile telephone with an integral satellite transceiver and an antenna for communicating directly with a satellite, for example.

The UT 400 may include a satellite handover circuit 425 that may allow the UT 400 to dynamically switch communications from a first satellite to a second satellite. In example implementations, the satellite handover circuit 425 may perform satellite handover operations by switching communications with the SAN 150 from the first satellite to the second satellite. In some aspects, the first and second satellites may be part of the same satellite constellation (such as a LEO constellation). In other aspects, the first and second satellites may be part of different satellite constellations (such as a LEO constellation and a MEO constellation, a MEO constellation and a GSO constellation, or a LEO constellation and a GSO constellation). Although not shown in FIG. 1 for simplicity, the UT 401 may also include a satellite handover circuit 425 that may allow the UT 401 to dynamically switch communications from a first satellite to a second satellite, for example, in a manner similar to that of the UT 400.

The SAN 150 may include gateways 200 and 201, infrastructure 106, and additional components (not shown for simplicity) for communicating with the satellite 300. The gateway 200 may have access to the Internet 108 or one or more other types of public, semiprivate or private networks. In the example illustrated in FIG. 1, the gateway 200 is in communication with infrastructure 106, which is capable of accessing the Internet 108 or one or more other types of public, semiprivate or private networks. The gateway 200 may also be coupled to various types of communication backhaul, including, for example, landline networks such as optical fiber networks or public switched telephone networks (PSTN) 110. Further, in alternative implementations, the gateway 200 may interface to the Internet 108, PSTN 110, or one or more other types of public, semiprivate or private networks without using infrastructure 106. Still further, gateway 200 may communicate with other gateways, such as gateway 201 through the infrastructure 106 or alternatively may be configured to communicate to gateway 201 without using infrastructure 106. Infrastructure 106 may include, in whole or part, a network control center (NCC), a satellite control center (SCC), a wired and/or wireless core network and/or any other components or systems used to facilitate operation of and/or communication with the satellite communication system 100.

The SAN 150 may include a satellite handover controller 152 that allows the SAN 150 to coordinate or otherwise facilitate switching communications with a user terminal (e.g., UT 400 and/or UT 401) from a first satellite to a second satellite. In some implementations, the first satellite may be part of (or associated with) a first constellation of satellites, and the second satellite may be part of (or associated with) a second constellation of satellites that is different than the first constellation of satellites. In some aspects, the first satellite may be an LEO satellite and the second satellite may be an MEO satellite. In other aspects, the first satellite may be an LEO satellite and the second satellite may be an GSO satellite. In still other aspects, the first satellite may be an MEO satellite and the second satellite may be an GSO satellite. In other implementations, the first and second satellites may be part of (or associated with) the same constellation of satellites (such as a constellation of NGSO satellites).

Communications between the satellite 300 and the gateway 200 in both directions are called feeder links, whereas communications between the satellite and each of the UTs 400 and 401 in both directions are called service links. A signal path from the satellite 300 to a ground station, which may be the gateway 200 or one of the UTs 400 and 401, may be generically called a downlink. A signal path from a ground station to the satellite 300 may be generically called an uplink. Additionally, as illustrated, signals can have a general directionality such as a forward link and a return link or reverse link. Accordingly, a communication link in a direction originating from the gateway 200 and terminating at the UT 400 through the satellite 300 is called a forward link, whereas a communication link in a direction originating from the UT 400 and terminating at the gateway 200 through the satellite 300 is called a return link or reverse link. As such, the signal path from the gateway 200 to the satellite 300 is labeled "Forward Feeder Link" whereas the signal path from the satellite 300 to the gateway 200 is labeled "Return Feeder Link" in FIG. 1. In a similar manner, the signal path from each UT 400 or 401 to the satellite 300 is labeled "Return Service Link" whereas the signal path from the satellite 300 to each UT 400 or 401 is labeled "Forward Service Link" in FIG. 1.

Figure 2:
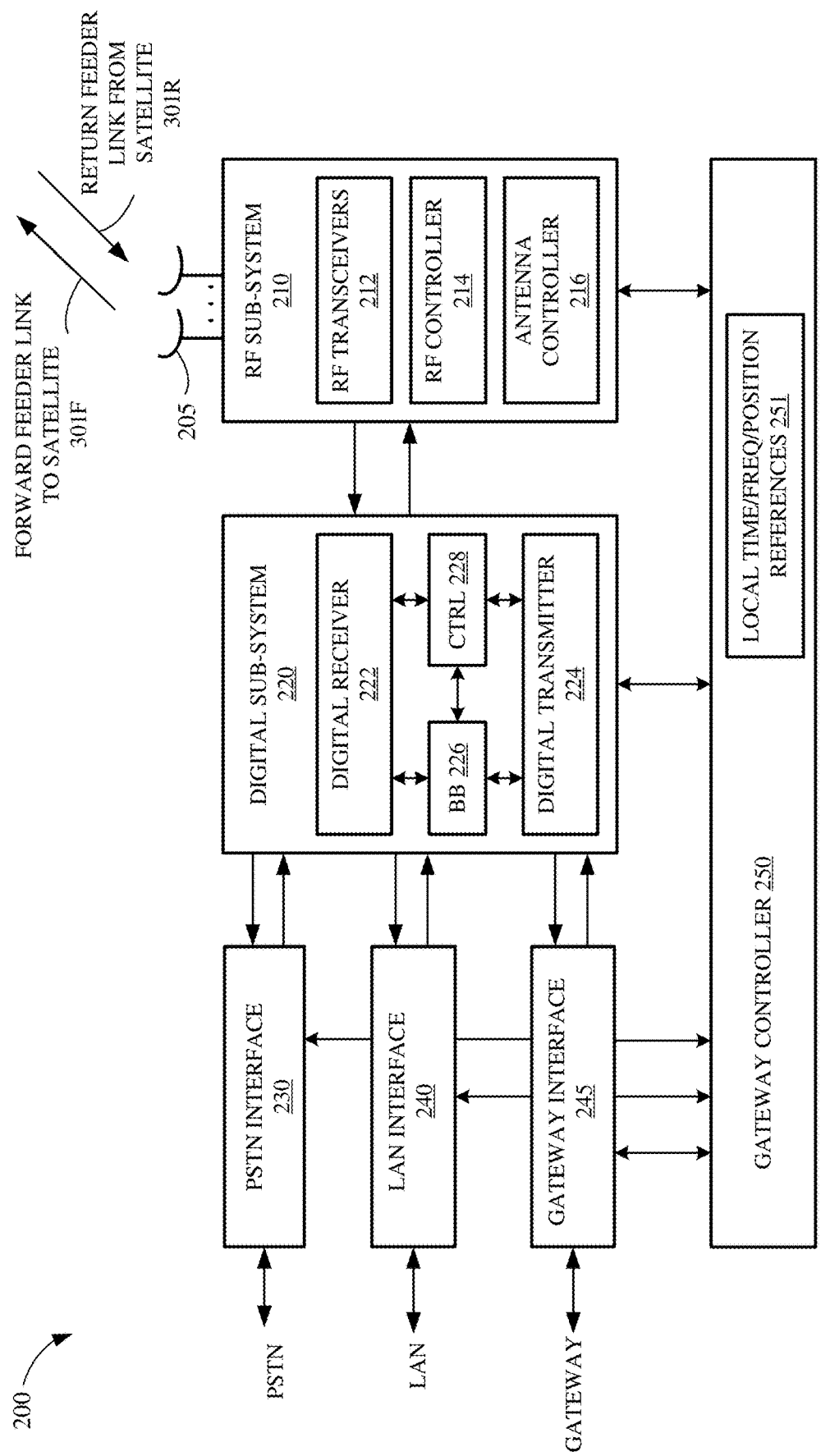
FIG. 2 shows a block diagram of one example of the gateway of FIG. 1.

FIG. 2 is an example block diagram of gateway 200, which also can apply to gateway 201 of FIG. 1. Gateway 200 is shown to include a number of antennas 205, an RF subsystem 210, a digital subsystem 220, a Public Switched Telephone Network (PSTN) interface 230, a Local Area Network (LAN) interface 240, a gateway interface 245, and a gateway controller 250. RF subsystem 210 is coupled to antennas 205 and to digital subsystem 220. Digital subsystem 220 is coupled to PSTN interface 230, to LAN interface 240, and to gateway interface 245. Gateway controller 250 is coupled to RF subsystem 210, digital subsystem 220, PSTN interface 230, LAN interface 240, and gateway interface 245.

RF subsystem 210, which may include a number of RF transceivers 212, an RF controller 214, and an antenna controller 216, may transmit communication signals to satellite 300 via a forward feeder link 301F, and may receive communication signals from satellite 300 via a return feeder link 301R. Although not shown for simplicity, each of the RF transceivers 212 may include a transmit chain and a receive chain. Each receive chain may include a low noise amplifier (LNA) and a down-converter (e.g., a mixer) to amplify and down-convert, respectively, received communication signals in a well-known manner In addition, each receive chain may include an analog-to-digital converter (ADC) to convert the received communication signals from analog signals to digital signals (e.g., for processing by digital subsystem 220). Each transmit chain may include an up-converter (e.g., a mixer) and a power amplifier (PA) to up-convert and amplify, respectively, communication signals to be transmitted to satellite 300 in a well-known manner In addition, each transmit chain may include a digital-to-analog converter (DAC) to convert the digital signals received from digital subsystem 220 to analog signals to be transmitted to satellite 300.

The RF controller 214 may be used to control various aspects of the number of RF transceivers 212 (e.g., selection of the carrier frequency, frequency and phase calibration, gain settings, and the like). The antenna controller 216 may control various aspects of the antennas 205 (e.g., beamforming, beam steering, gain settings, frequency tuning, and the like).

The digital subsystem 220 may include a number of digital receiver modules 222, a number of digital transmitter modules 224, a baseband (BB) processor 226, and a control (CTRL) processor 228. Digital subsystem 220 may process communication signals received from RF subsystem 210 and forward the processed communication signals to PSTN interface 230 and/or LAN interface 240, and may process communication signals received from PSTN interface 230 and/or LAN interface 240 and forward the processed communication signals to RF subsystem 210.

Each digital receiver module 222 may correspond to signal processing elements used to manage communications between gateway 200 and UT 400. One of the receive chains of RF transceivers 212 may provide input signals to multiple digital receiver modules 222. A number of digital receiver modules 222 may be used to accommodate all of the satellite beams and possible diversity mode signals being handled at any given time. Although not shown for simplicity, each digital receiver module 222 may include one or more digital data receivers, a searcher receiver, and a diversity combiner and decoder circuit. The searcher receiver may be used to search for appropriate diversity modes of carrier signals, and may be used to search for pilot signals (or other relatively fixed pattern strong signals).

The digital transmitter modules 224 may process signals to be transmitted to UT 400 via satellite 300. Although not shown for simplicity, each digital transmitter module 224 may include a transmit modulator that modulates data for transmission. The transmission power of each transmit modulator may be controlled by a corresponding digital transmit power controller (not shown for simplicity) that may (1) apply a minimum level of power for purposes of interference reduction and resource allocation and (2) apply appropriate levels of power when needed to compensate for attenuation in the transmission path and other path transfer characteristics.

The control processor 228, which is coupled to digital receiver modules 222, digital transmitter modules 224, and baseband processor 226, may provide command and control signals to effect functions such as, but not limited to, signal processing, timing signal generation, power control, handoff control, diversity combining, and system interfacing.

The control processor 228 may also control the generation and power of pilot, synchronization, and paging channel signals and their coupling to the transmit power controller (not shown for simplicity). The pilot channel is a signal that is not modulated by data, and may use a repetitive unchanging pattern or non-varying frame structure type (pattern) or tone type input. For example, the orthogonal function used to form the channel for the pilot signal generally has a constant value, such as all 13 s or 0's, or a well-known repetitive pattern, such as a structured pattern of interspersed 1's and 0's.

Baseband processor 226 is well known in the art and is therefore not described in detail herein. For example, the baseband processor 226 may include a variety of known elements such as (but not limited to) coders, data modems, and digital data switching and storage components.

The PSTN interface 230 may provide communication signals to, and receive communication signals from, an external PSTN either directly or through additional infrastructure 106, as illustrated in FIG. 1. The PSTN interface 230 is well known in the art, and therefore is not described in detail herein. For other implementations, the PSTN interface 230 may be omitted, or may be replaced with any other suitable interface that connects gateway 200 to a ground-based network (e.g., the Internet).

The LAN interface 240 may provide communication signals to, and receive communication signals from, an external LAN. For example, LAN interface 240 may be coupled to the internet 108 either directly or through additional infrastructure 106, as illustrated in FIG. 1. The LAN interface 240 is well known in the art, and therefore is not described in detail herein.

The gateway interface 245 may provide communication signals to, and receive communication signals from, one or more other gateways associated with the satellite communication system 100 of FIG. 1 (and/or to/from gateways associated with other satellite communication systems, not shown for simplicity). For some implementations, gateway interface 245 may communicate with other gateways via one or more dedicated communication lines or channels (not shown for simplicity). For other implementations, gateway interface 245 may communicate with other gateways using PSTN 110 and/or other networks such as the Internet 108 (see also FIG. 1). For at least one implementation, gateway interface 245 may communicate with other gateways via infrastructure 106.

Overall gateway control may be provided by gateway controller 250. The gateway controller 250 may plan and control utilization of satellite 300's resources by gateway 200. For example, the gateway controller 250 may analyze trends, generate traffic plans, allocate satellite resources, monitor (or track) satellite positions, and monitor the performance of gateway 200 and/or satellite 300. The gateway controller 250 may also be coupled to a ground-based satellite controller (not shown for simplicity) that maintains and monitors orbits of satellite 300, relays satellite usage information to gateway 200, tracks the positions of satellite 300, and/or adjusts various channel settings of satellite 300.

For the example implementation illustrated in FIG. 2, the gateway controller 250 includes a local time, frequency, and position references 251, which may provide local time and frequency information to the RF subsystem 210, the digital subsystem 220, and/or the interfaces 230, 240, and 245. The time and frequency information may be used to synchronize the various components of gateway 200 with each other and/or with satellite(s) 300. The local time, frequency, and position references 251 may also provide position information (e.g., ephemeris data) of satellite(s) 300 to the various components of gateway 200. Further, although depicted in FIG. 2 as included within gateway controller 250, for other implementations, the local time, frequency, and position references 251 may be a separate subsystem that is coupled to gateway controller 250 (and/or to one or more of digital subsystem 220 and RF subsystem 210).

Although not shown in FIG. 2 for simplicity, the gateway controller 250 may also be coupled to a network control center (NCC) and/or a satellite control center (SCC). For example, the gateway controller 250 may allow the SCC to communicate directly with satellite(s) 300, for example, to retrieve ephemeris data from satellite(s) 300. The gateway controller 250 may also receive processed information (e.g., from the SCC and/or the NCC) that allows gateway controller 250 to properly aim its antennas 205 (e.g., at the appropriate satellite(s) 300), to schedule beam transmissions, to coordinate handovers, and to perform various other well-known functions.

Figure 3:
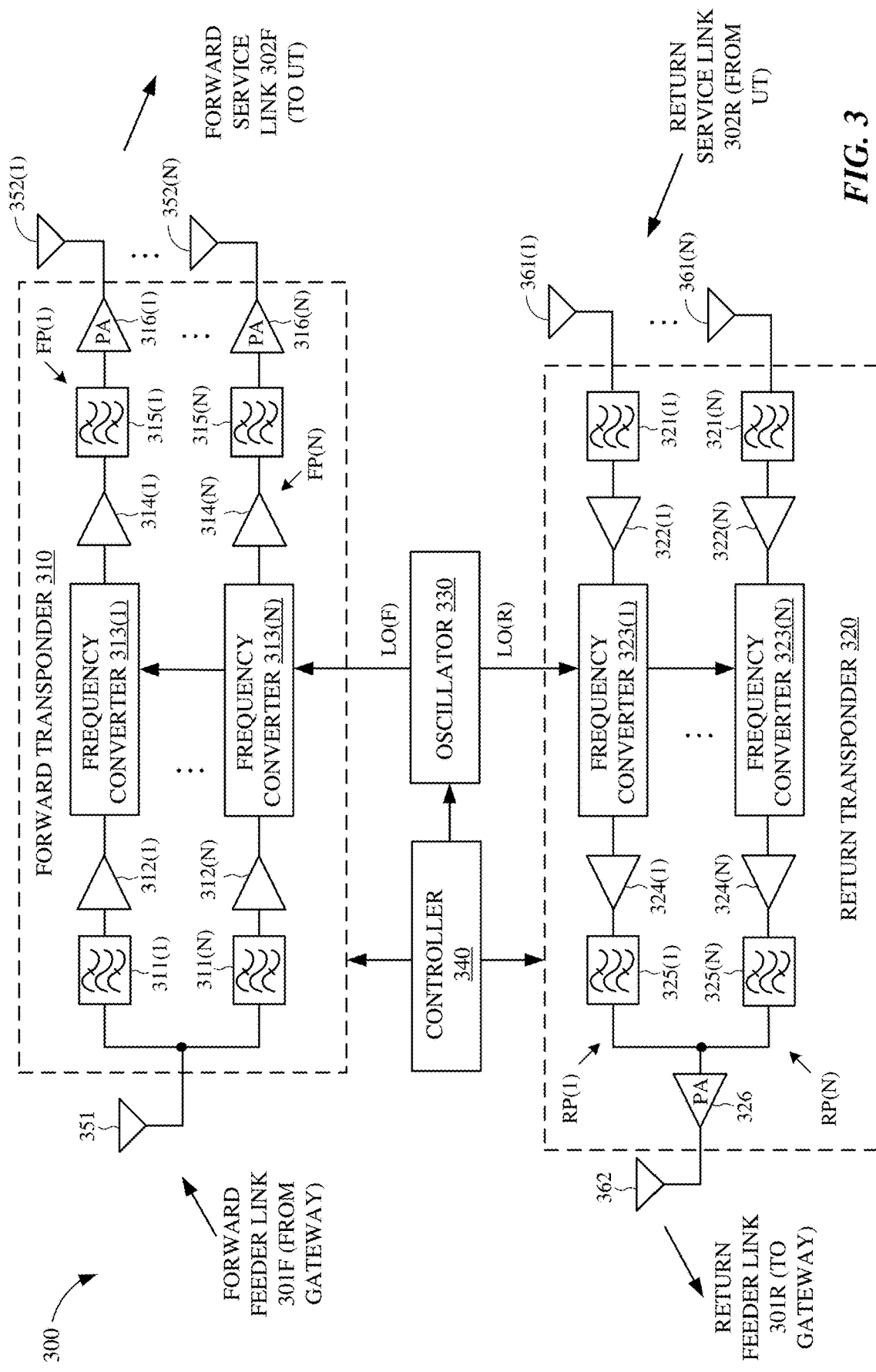
FIG. 3 shows a block diagram of one example of the satellite of FIG. 1.

FIG. 3 is an example block diagram of satellite 300 for illustrative purposes only. It will be appreciated that specific satellite configurations can vary significantly and may or may not include on-board processing. Further, although illustrated as a single satellite, two or more satellites using inter-satellite communication may provide the functional connection between the gateway 200 and UT 400. It will be appreciated that disclosure is not limited to any specific satellite configuration and any satellite or combinations of satellites that can provide the functional connection between the gateway 200 and UT 400 can be considered within the scope of the disclosure. In one example, satellite 300 is shown to include a forward transponder 310, a return transponder 320, an oscillator 330, a controller 340, forward link antennas 351-352, and return link antennas 361-362. The forward transponder 310, which may process communication signals within a corresponding channel or frequency band, may include a respective one of first bandpass filters 311(1)-311(N), a respective one of first LNAs 312(1)-312(N), a respective one of frequency converters 313(1)-313(N), a respective one of second LNAs 314(1)-314(N), a respective one of second bandpass filters 315(1)-315(N), and a respective one of PAs 316(1)-316(N). Each of the PAs 316(1)-316(N) is coupled to a respective one of antennas 352(1)-352(N), as shown in FIG. 3.

Within each of the respective forward paths FP(1)-FP(N), the first bandpass filter 311 passes signal components having frequencies within the channel or frequency band of the respective forward path FP, and filters signal components having frequencies outside the channel or frequency band of the respective forward path FP. Thus, the pass band of the first bandpass filter 311 corresponds to the width of the channel associated with the respective forward path FP. The first LNA 312 amplifies the received communication signals to a level suitable for processing by the frequency converter 313. The frequency converter 313 converts the frequency of the communication signals in the respective forward path FP (e.g., to a frequency suitable for transmission from satellite 300 to UT 400). The second LNA 314 amplifies the frequency-converted communication signals, and the second bandpass filter 315 filters signal components having frequencies outside of the associated channel width. The PA 316 amplifies the filtered signals to a power level suitable for transmission to UTs 400 via respective antenna 352. The return transponder 320, which includes a number N of return paths RP(1)-RP(N), receives communication signals from UT 400 along return service link 302R via antennas 361(1)-361(N), and transmits communication signals to gateway 200 along return feeder link 301R via one or more antennas 362. Each of the return paths RP(1)-RP(N), which may process communication signals within a corresponding channel or frequency band, may be coupled to a respective one of antennas 361(1)-361(N), and may include a respective one of first bandpass filters 321(1)-321(N), a respective one of first LNAs 322(1)-322(N), a respective one of frequency converters 323(1)-323(N), a respective one of second LNAs 324(1)-324(N), and a respective one of second bandpass filters 325(1)-325(N).

Within each of the respective return paths RP(1)-RP(N), the first bandpass filter 321 passes signal components having frequencies within the channel or frequency band of the respective return path RP, and filters signal components having frequencies outside the channel or frequency band of the respective return path RP. Thus, the pass band of the first bandpass filter 321 may for some implementations correspond to the width of the channel associated with the respective return path RP. The first LNA 322 amplifies all the received communication signals to a level suitable for processing by the frequency converter 323. The frequency converter 323 converts the frequency of the communication signals in the respective return path RP (e.g., to a frequency suitable for transmission from satellite 300 to gateway 200). The second LNA 324 amplifies the frequency-converted communication signals, and the second bandpass filter 325 filters signal components having frequencies outside of the associated channel width. Signals from the return paths RP(1)-RP(N) are combined and provided to the one or more antennas 362 via a PA 326. The PA 326 amplifies the combined signals for transmission to the gateway 200.

Oscillator 330, which may be any suitable circuit or device that generates an oscillating signal, provides a forward local oscillator signal LO(F) to the frequency converters 313(1)-313(N) of forward transponder 310, and provides a return local oscillator signal LO(R) to frequency converters 323(1)-323(N) of return transponder 320. For example, the LO(F) signal may be used by frequency converters 313(1)-313(N) to convert communication signals from a frequency band associated with the transmission of signals from gateway 200 to satellite 300 to a frequency band associated with the transmission of signals from satellite 300 to UT 400. The LO(R) signal may be used by frequency converters 323(1)-323(N) to convert communication signals from a frequency band associated with the transmission of signals from UT 400 to satellite 300 to a frequency band associated with the transmission of signals from satellite 300 to gateway 200.

Controller 340, which is coupled to forward transponder 310, return transponder 320, and oscillator 330, may control various operations of satellite 300 including (but not limited to) channel allocations. In one aspect, the controller 340 may include a memory coupled to a processor (not shown for simplicity). The memory may include a non-transitory computer-readable medium (e.g., one or more nonvolatile memory elements, such as EPROM, EEPROM, Flash memory, a hard drive, etc.) storing instructions that, when executed by the processor, cause the satellite 300 to perform operations including (but not limited to) those described herein with respect to FIGS. 10 and 11.

Figure 4:
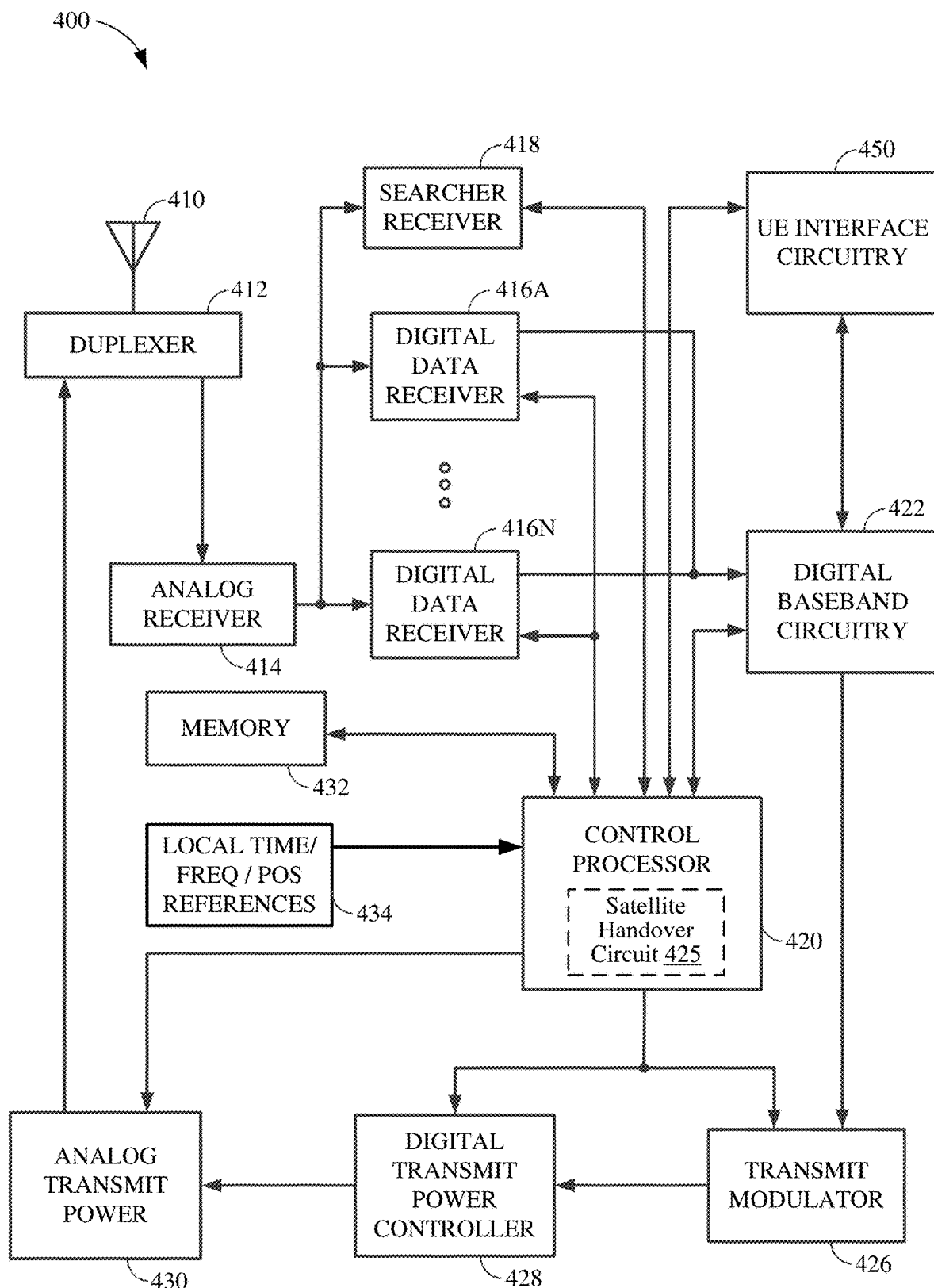
FIG. 4 shows a block diagram of one example of the user terminal (UT) of FIG. 1.

An example of a transceiver for use in the UT 400 or 401 is illustrated in FIG. 4. In FIG. 4, at least one antenna 410 is provided for receiving forward link communication signals (e.g., from satellite 300), which are transferred to an analog receiver 414, where they are down-converted, amplified, and digitized. A duplexer element 412 is often used to allow the same antenna to serve both transmit and receive functions. Alternatively, a UT transceiver may employ separate antennas for operating at different transmit and receive frequencies.

The digital communication signals output by the analog receiver 414 are transferred to at least one digital data receiver 416A and at least one searcher receiver 418. Additional digital data receivers to 416N can be used to obtain desired levels of signal diversity, depending on the acceptable level of transceiver complexity, as would be apparent to one skilled in the relevant art.

At least one user terminal control processor 420 is coupled to digital data receivers 416A-416N and searcher receiver 418. The control processor 420 provides, among other functions, basic signal processing, timing, power and handoff control or coordination, and selection of frequency used for signal carriers. Another basic control function that may be performed by the control processor 420 is the selection or manipulation of functions to be used for processing various signal waveforms. Signal processing by the control processor 420 can include a determination of relative signal strength and computation of various related signal parameters. Such computations of signal parameters, such as timing and frequency may include the use of additional or separate dedicated circuitry to provide increased efficiency or speed in measurements or improved allocation of control processing resources.

The UT 400 may include a satellite handover circuit 425 that may allow the UT 400 to dynamically switch communications from a first satellite to a second satellite. In example implementations, the satellite handover circuit 425 may perform satellite handover operations by switching communications with the SAN 150 from the first satellite to the second satellite. In some aspects, the first and second satellites may be part of the same satellite constellation (such as a LEO constellation). In other aspects, the first and second satellites may be part of different satellite constellations (such as a LEO constellation and a MEO constellation, a MEO constellation and a GSO constellation, or a LEO constellation and a GSO constellation).

The outputs of digital data receivers 416A-416N are coupled to digital baseband circuitry 422 within the user terminal. The digital baseband circuitry 422 comprises processing and presentation elements used to transfer information to and from UE 500 as shown in FIG. 1, for example. Referring to FIG. 4, if diversity signal processing is employed, the digital baseband circuitry 422 may comprise a diversity combiner and decoder. Some of these elements may also operate under the control of, or in communication with, a control processor 420.

When voice or other data is prepared as an output message or communications signal originating with the user terminal, the digital baseband circuitry 422 is used to receive, store, process, and otherwise prepare the desired data for transmission. The digital baseband circuitry 422 provides this data to a transmit modulator 426 operating under the control of the control processor 420. The output of the transmit modulator 426 is transferred to a power controller 428 which provides output power control to a transmit power amplifier 430 for final transmission of the output signal from the antenna 410 to a satellite (e.g., satellite 300).

In FIG. 4, the UT transceiver also includes a memory 432 associated with the control processor 420. The memory 432 may include instructions for execution by the control processor 420 as well as data for processing by the control processor 420.

In the example illustrated in FIG. 4, the UT 400 also includes an optional local time, frequency and/or position references 434 (e.g., an SPS receiver), which may provide local time, frequency and/or position information to the control processor 420 for various applications, including, for example, time and frequency synchronization for the UT 400.

Digital data receivers 416A-416N and searcher receiver 418 are configured with signal correlation elements to demodulate and track specific signals. Searcher receiver 418 is used to search for pilot signals, or other relatively fixed pattern strong signals, while digital data receivers 416A-416N are used to demodulate other signals associated with detected pilot signals. However, a digital data receiver 416 can be assigned to track the pilot signal after acquisition to accurately determine the ratio of signal chip energies to signal noise, and to formulate pilot signal strength. Therefore, the outputs of these units can be monitored to determine the energy in, or frequency of, the pilot signal or other signals. These receivers also employ frequency tracking elements that can be monitored to provide current frequency and timing information to control processor 420 for signals being demodulated.

The control processor 420 may use such information to determine to what extent the received signals are offset from the oscillator frequency, when scaled to the same frequency band, as appropriate. This and other information related to frequency errors and frequency shifts can be stored in a storage or memory element 432 as desired.

The control processor 420 may also be coupled to UE interface circuitry 450 to allow communications between UT 400 and one or more UEs. UE interface circuitry 450 may be configured as desired for communication with various UE configurations and accordingly may include various transceivers and related components depending on the various communication technologies employed to communicate with the various UEs supported. For example, UE interface circuitry 450 may include one or more antennas, a wide area network (WAN) transceiver, a wireless local area network (WLAN) transceiver, a Local Area Network (LAN) interface, a Public Switched Telephone Network (PSTN) interface and/or other known communication technologies configured to communicate with one or more UEs in communication with UT 400.

Figure 5:
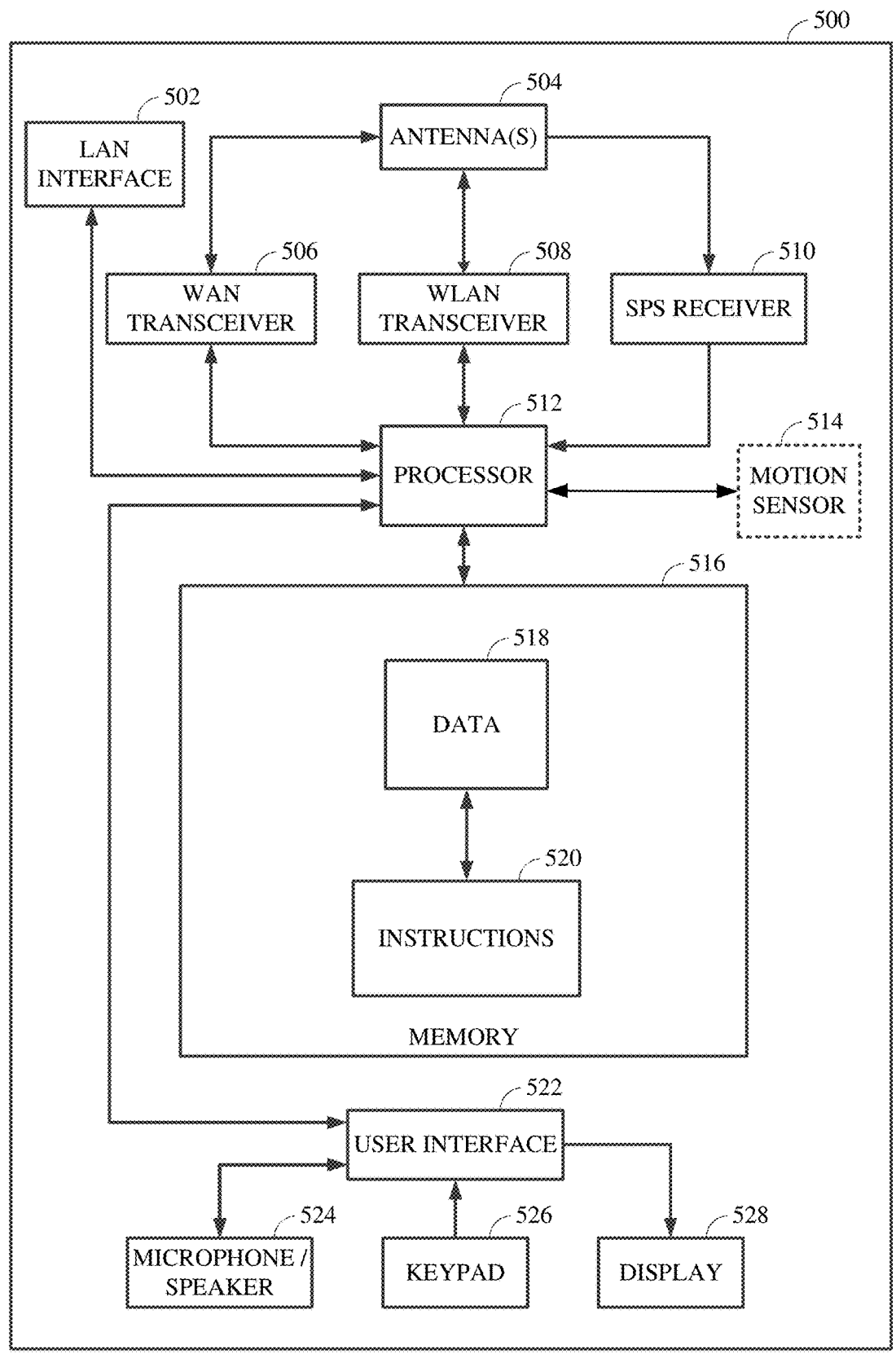
FIG. 5 shows a block diagram of one example of the user equipment (UE) of FIG. 1.

FIG. 5 is a block diagram illustrating an example of UE 500, which also can apply to UE 501 of FIG. 1. The UE 500 as shown in FIG. 5 may be a mobile device, a handheld computer, a tablet, a wearable device, a smart watch, or any type of device capable of interacting with a user, for example. Additionally, the UE may be a network side device that provides connectivity to various ultimate end user devices and/or to various public or private networks. In the example shown in FIG. 5, the UE 500 may comprise a LAN interface 502, one or more antennas 504, a wide area network (WAN) transceiver 506, a wireless local area network (WLAN) transceiver 508, and a satellite positioning system (SPS) receiver 510. The SPS receiver 510 may be compatible with the Global Positioning System (GPS), the Global Navigation Satellite System (GLONASS) and/or any other global or regional satellite based positioning system. In an alternate aspect, the UE 500 may include a WLAN transceiver 508, such as a Wi-Fi transceiver, with or without the LAN interface 502, WAN transceiver 506, and/or SPS receiver 510, for example. Further, UE 500 may include additional transceivers such as Bluetooth, ZigBee and other known technologies, with or without the LAN interface 502, WAN transceiver 506, WLAN transceiver 508 and/or SPS receiver 510. Accordingly, the elements illustrated for UE 500 are provided merely as an example configuration and are not intended to limit the configuration of UEs in accordance with the various aspects disclosed herein.

In the example shown in FIG. 5, a processor 512 is connected to the LAN interface 502, the WAN transceiver 506, the WLAN transceiver 508 and the SPS receiver 510. Optionally, a motion sensor 514 and other sensors may also be coupled to the processor 512.

A memory 516 is connected to the processor 512. In one aspect, the memory 516 may include data 518 which may be transmitted to and/or received from the UT 400, as shown in FIG. 1. Referring to FIG. 5, the memory 516 may also include stored instructions 520 to be executed by the processor 512 to perform the process steps for communicating with the UT 400, for example. Furthermore, the UE 500 may also include a user interface 522, which may include hardware and software for interfacing inputs or outputs of the processor 512 with the user through light, sound or tactile inputs or outputs, for example. In the example shown in FIG. 5, the UE 500 includes a microphone/speaker 524, a keypad 526, and a display 528 connected to the user interface 522. Alternatively, the user's tactile input or output may be integrated with the display 528 by using a touch-screen display, for example. Once again, the elements illustrated in FIG. 5 are not intended to limit the configuration of the UEs disclosed herein and it will be appreciated that the elements included in the UE 500 will vary based on the end use of the device and the design choices of the system engineers.

Additionally, the UE 500 may be a user device such as a mobile device or external network side device in communication with but separate from the UT 400 as illustrated in FIG. 1, for example. Alternatively, the UE 500 and the UT 400 may be integral parts of a single physical device.

As mentioned above, GSO satellites are deployed in geostationary orbits at approximately 35,000 km above the earth's surface, and revolve around the Earth in an equatorial orbit at the earth's own angular velocity, for example, such that GSO satellites appear motionless in the sky to a stationary observer on Earth. In contrast, NGSO satellites such as LEO and MEO satellites are deployed in non-geostationary orbits and revolve around the earth above various paths of the earth's surface at relatively low altitudes and relatively fast speeds (e.g., as compared with GSO satellites). For example, LEO satellites typically employ orbits between approximately 160 km and 2,000 km above the surface of the Earth, and MEO satellites typically employ orbits between approximately 2,000 km and 35,000 km above the surface of the Earth. MEO satellites are visible to observers on Earth for much longer periods of time than LEO satellites, and typically have a larger coverage area (such as a wider footprint) on Earth than LEO satellites. The longer durations of visibility and wider footprints of MEO satellites means that fewer satellites are needed in an MEO constellation than in an LEO constellation to provide similar coverage areas on Earth. However, because MEO satellites orbit the Earth at much greater altitudes than LEO satellites, MEO satellites have much longer signal propagation delays than LEO satellites.

In some implementations, a satellite system may include a number of different satellite constellations to provide coverage area on Earth for user terminals (such as the UT 400 of FIG. 4). In some aspects, the satellite system may include a constellation of LEO satellites and a constellation of MEO satellites. In other aspects, the satellite system may include a constellation of LEO satellites and a constellation of GSO satellites. In still other aspects, the satellite system may include a constellation of LEO satellites, a constellation of MEO satellites, and a constellation of GSO satellites. In addition, or in the alternative, the satellite system may include more than one constellation of LEO satellites, more than one constellation of MEO satellites, more than one constellation of GSO satellites, or any combination thereof.

Figure 6:
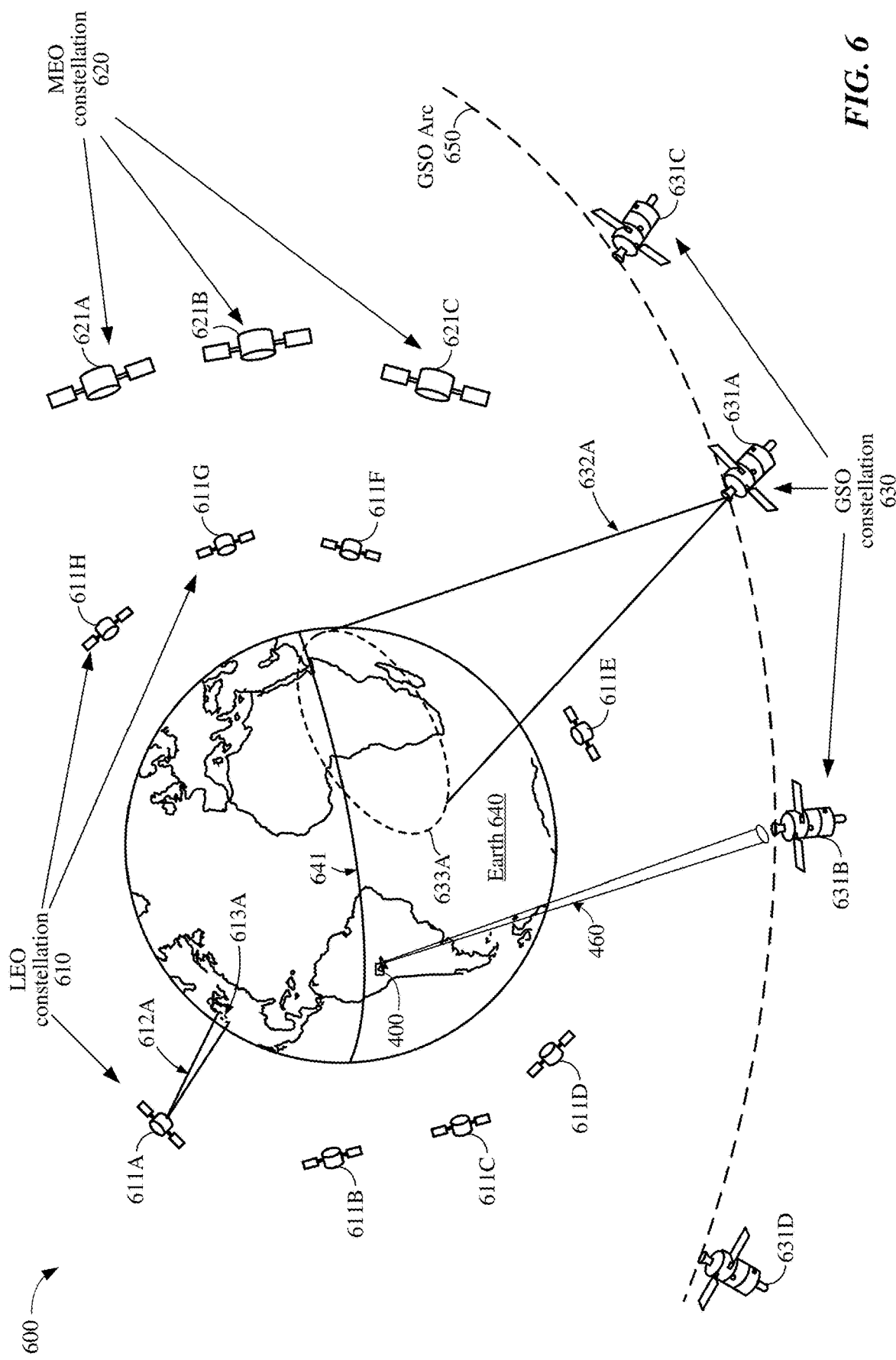
FIG. 6 shows a diagram depicting an example satellite system.

FIG. 6 shows an example satellite system 600 deployed in orbit around Earth 640. The example satellite system 600 is shown to include an LEO satellite constellation 610, an MEO satellite constellation 620, and a GSO constellation 630. The LEO satellite constellation 610 is shown to include a plurality of LEO satellites 611A-611H, the MEO satellite constellation 620 is shown to include a plurality of MEO satellites 621A-621C, and the GSO satellite constellation 630 is shown to include a plurality of GSO satellites 631A-631D. In some aspects, each of LEO satellites 611A-611H may be one example of the satellite 300 of FIGS. 1 and 3. In addition, or in the alternative, each of the MEO satellites 621A-621C may be one example of the satellite 300 of FIGS. 1 and 3, or each of the GSO satellites 631A-631D may be one example of the satellite 300 of FIGS. 1 and 3 (or both). Although the LEO constellation 610 is shown in FIG. 6 as including only eight satellites 611A-611H for simplicity, the LEO constellation 610 may include any suitable number of satellites 611, for example, to provide world-wide satellite coverage. Similarly, although the MEO constellation 620 is shown in FIG. 6 as including only three satellites 621A-621C for simplicity, the MEO constellation 620 may include any suitable number of satellites 621, for example, to provide world-wide satellite coverage. Likewise, although the GSO constellation 630 is shown in FIG. 6 as including only four satellites 631A-631D for simplicity, the GSO constellation 630 may include any suitable number of satellites 631. As used herein, the "LEO satellite 611" may refer to any one (or more) of the LEO satellites 611A-611H of FIG. 6, the "MEO satellite 621" may refer to any one (or more) of the MEO satellites 621A-621C of FIG. 6, and the "GSO satellite 631" may refer to any one (or more) of the GSO satellites 631A-631D of FIG. 6.

The LEO satellites 611A-611H may orbit the Earth 640 in any suitable number of non-geosynchronous orbital planes (not shown for simplicity), and each of the orbital planes may include a plurality of the LEO satellites. Similarly, the MEO satellites 621A-621C may orbit the Earth 640 in any suitable number of non-geosynchronous orbital planes (not shown for simplicity), and each of the orbital planes may include a plurality of the MEO satellites. The non-geosynchronous orbital planes may include, for example, polar orbital patterns and/or Walker orbital patterns. To a stationary observer on Earth 640, the LEO satellites 611A-611H and the MEO satellites 621A-621C appear to move quickly across the sky in a plurality of different paths across the Earth's surface. In contrast, the GSO satellites 631A-631D may appear, to a stationary observer on Earth 640, motionless in a fixed position in the sky located above the earth's equator 641. It is noted that for a given point on the surface of Earth 640, there may be an arc of positions in the sky along which the GSO satellites 631A-631D may be located. This arc of GSO satellite positions may be referred to herein as the GSO arc 650.

Each the LEO satellites 611A-611H may include a number of directional antennas to provide high-speed forward links (e.g., downlinks) with user terminals such as UT 400 of FIG. 1 and/or with gateways such as gateway 200 of FIG. 1, while each of the GSO satellites 631A-631D may include a number of omni-directional antennas to provide satellite coverage over large portions of the Earth's surface. In some implementations, each the MEO satellites 621A-621C may include a number of directional antennas to provide high-speed forward links (e.g., downlinks) with user terminals such as UT 400 of FIG. 1 and/or with gateways such as gateway 200 of FIG. 1. A high-gain directional antenna achieves higher data rates and is less susceptible to interference than an omni-directional antenna by focusing radiation into a relatively narrow beam width (as compared to the relatively wide beam width associated with an omni-directional antenna). For example, as depicted in FIG. 6, the coverage area 613A provided by a beam 612A transmitted from LEO satellite 611A is relatively small compared to the coverage area 633A provided by a beam 632A transmitted from GSO satellite 631A. Accordingly, although not shown in FIG. 6 for simplicity, the footprint of each of the LEO satellites 611A-611H may be significantly smaller than the footprint of each of the GSO satellites 631A-631D.

The UT 400 may include or be associated with one or more directional antennas to provide high-speed return links (e.g., uplinks) to LEO satellites 611A-611H, to MEO satellites 621A-621C, and/or to GSO satellites 631A-631D. For example, a beam 460 transmitted from UT 400 may also have a relatively narrow beam width (e.g., as compared to the relatively wide beam width of an omni-directional antenna typically associated with a GSO earth station, not shown for simplicity). The relatively narrow beam widths associated with UT 400 may create challenges when switching communications from a first satellite to a second satellite, particularly when the first and second satellites are part of (or belong to) different satellite constellations (and therefore may have different orbital patterns, different propagation delays, different carrier signals, different modulation and coding schemes (MCSs), and so on).

Figure 7:
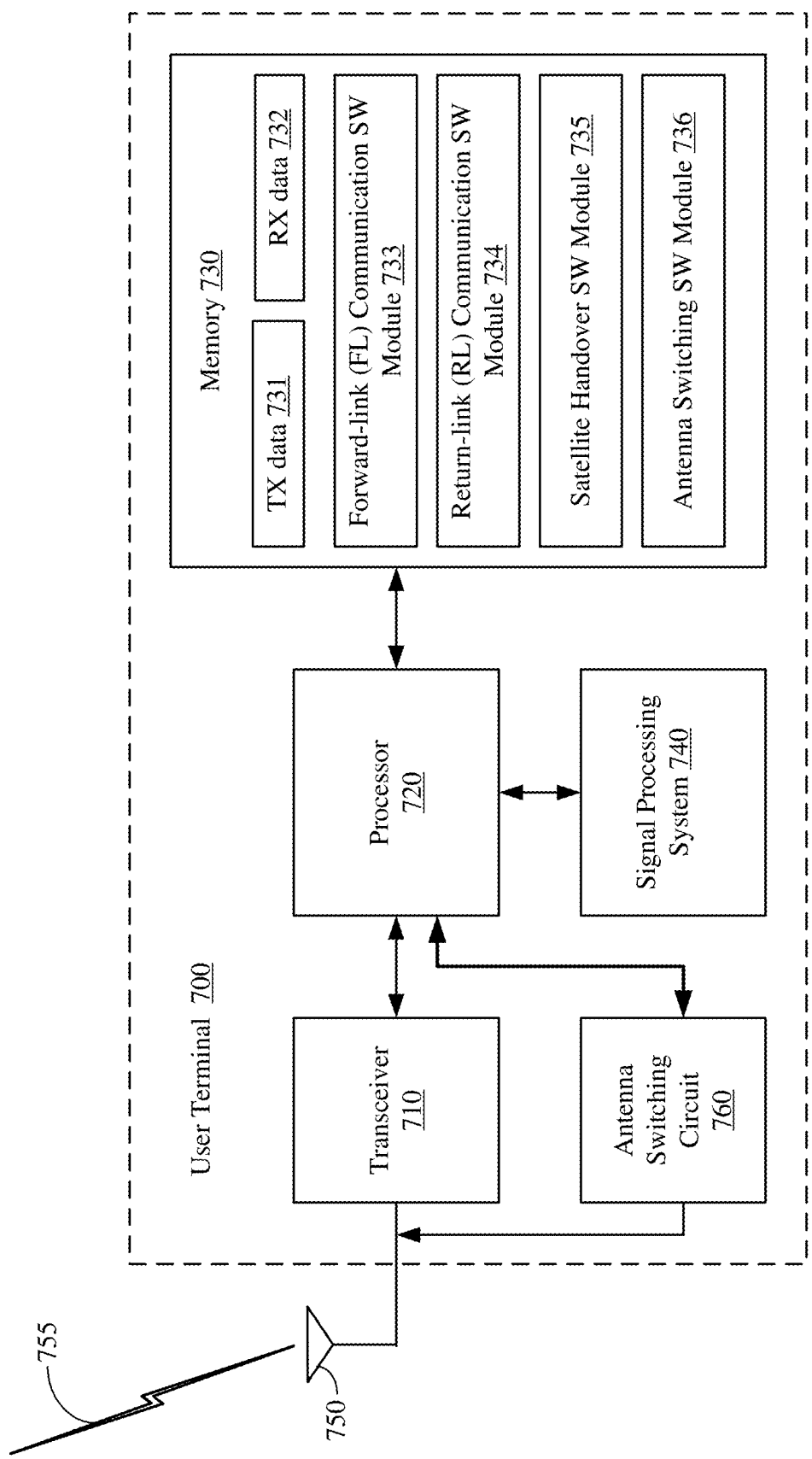
FIG. 7 shows a block diagram of an example user terminal.

FIG. 7 shows a block diagram of an example user terminal (UT) 700. The UT 700 may be one implementation of any of the UTs 400 and/or 401 of FIG. 4. The UT 700 includes a transceiver 710, a processor 720, a memory 730, a signal processing system 740, an antenna 750, and an antenna switching circuit 760. The transceiver 710 may be used to transmit signals to and receive signals from satellites, UEs, and/or other suitable wireless devices. In some implementations, the transceiver 710 may employ a single modem, for example, to minimize cost and complexity of the UT 700 (although using a single modem to communicate with satellites which may belong to different constellations and which may transmit at different frequencies and/or using different modulation schemes may be challenging).

The transceiver 710 may employ various types of coding (encoding and decoding) schemes including, for example, block coding, convolutional or turbo coding, or any combination thereof. In some implementations, the transceiver 710 may use concatenating coding in which an outer code is used with an inner code to decode data received from a satellite and to encode data to be transmitted to a satellite. For example, in some aspects, a satellite may use a Bose-Chaudhuri-Hocquenghem (BCH) code as an outer code and use a turbo code as an inner code to encode data for transmission to the UT 700 on a forward link, and the UT 700 may use the BCH code as the outer code and use the turbo code as the inner code to decode the data received from the satellite. In other implementations, the transceiver 710 may use interleaving, which may be considered to be part of the coding scheme. In addition, a Cyclic Redundancy Check (CRC) may be generated from information bits in a data structure and appended thereto for error control.

The transceiver 710 also may translate data symbols (e.g., bits) of a block into channel symbols. For example, every B bits in a block may be grouped together, and each of the blocks may be mapped to a point in a modulation constellation, for example, so that a signal containing the blocks can be mapped to as many as $2^B$ constellation points. The combination of modulation and coding schemes used by the UT 700 and a corresponding satellite may be represented by a Modulation and Coding Index (MCI) value.

In some implementations, the UT 700 may employ blind detection and error control in which the MCI for the block being decoding is not transmitted along with the block. Regardless of whether the MCIs are transmitted or not, different modulation and coding schemes may be employed for different blocks. In this manner, multiple modulation and coding schemes (MCSs) may be used to transmit, within the same slot, multiple blocks destined for one or more UTs. The various satellite communication links may utilize various medium access schemes such as, for example, single carrier TDMA. The signal constellation space may represent any one of a number of well-known modulation techniques including, for example, Phase Shift Keying (PSK), Quadrature Phase Shift Keying (QPSK), or Quadrature Amplitude Modulation (QAM). The QAM transmission schemes may include 16-QAM, 64-QAM, 128-QAM, 256-QAM, and so on.

The antenna 750 is coupled to the transceiver 710, and may be any suitable high-gain directional antenna. In some implementations, the antenna 750 may be configured for transmitting or receiving (or both) right-hand polarized electromagnetic radiation or left-hand polarized electromagnetic radiation, and may include multiple elements or components (such as for beam steering). In some aspects, the antenna 750 may include a transmission antenna configured for right-hand or left-hand polarization, and may include a receive antenna configured for right-hand or left-hand polarization. In other aspects, the antenna 750 may include a transmission antenna configured for one of right-hand or left-hand polarization, and may include a receive antenna configured for the other of right-hand or left-hand polarization (such as to provide isolation between FL communications and RL communications of the UT 700). In other implementations, the antenna 750 may be configured to transmit and receive other wireless signals or communications). In some aspects, the antenna 750 may be configured to have a transmit bandwidth suitable for transmitting signals to LEO satellites (such as LEO satellites 611A-611H), and configured to have a receive bandwidth suitable for receiving signals from LEO satellites 611A-611H, from MEO satellites (such as MEO satellites 621A-621C), and from GSO satellites (such as GSO satellites 631A-631D). In addition, or in the alternative, the antenna 750 may include separate apertures (such as one aperture for transmission and another aperture for reception).

The antenna 750 may facilitate a satellite link 755 between the UT 700 and a selected one (or more) of a number of satellites belonging to different types of satellite constellations using a single transceiver 710 provided in the UT 700. For example, referring also to FIG. 6, the antenna 750 may establish and receive data on a FL of one of the LEO satellites 611A-611H during a first time period, may establish and receive data on a FL of one of the MEO satellites 621A-621C during a second time period, and may establish and receive data on a FL of one of the GSO satellites 631A-631D during a third time period. In some implementations, the MEO satellites 621A-621C and the GSO satellites 631A-631D may not provide a return link upon which the UT 700 may transmit control information or messages to the gateway 200 (e.g., to the SAN 150). As explained below, the UT 700 may use the return link provided by LEO satellites 611A-611H to transmit control information or messages to the SAN 150, irrespective of which satellite or satellite constellation is providing forward link data to the UT 700.

The memory 730 includes a transmit (TX) data store 731 and a receive (RX) data store 732. The TX data store 731 may store outgoing data to be transmitted on a forward link of a satellite beam. In some implementations, the TX data store 731 may store FL data associated with ongoing HARQ processes maintained by one or more of the schedulers for forward-link communications received from a network controller. The RX data store 732 may store incoming data received on a return link of a satellite beam. In some implementations, the RX data store 732 may store RL data associated with ongoing HARQ processes maintained by one or more of the schedulers for return-link communications sent to the network controller.

Figure 12:
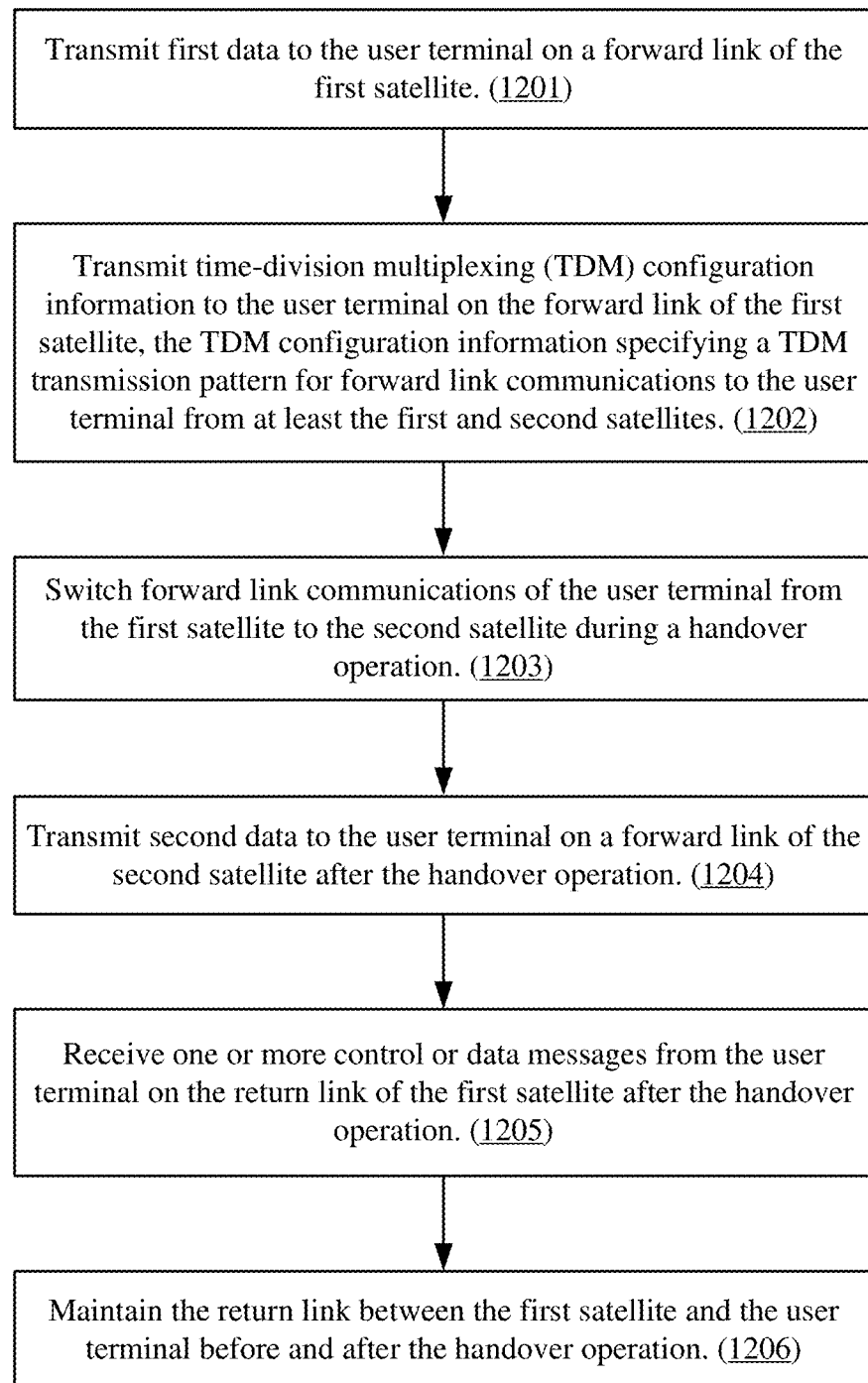
FIG. 12 shows an illustrative flow chart depicting an example satellite handover operation.

The memory 730 may also include a non-transitory computer-readable medium (e.g., one or more nonvolatile memory elements, such as EPROM, EEPROM, Flash memory, a hard drive, etc.) that may store at least the following software (SW) modules:

- a forward-link (FL) communication SW module 733 to preserve and/or maintain ongoing forward link communications during inter-satellite handover operations (and during inter-beam handover operations), for example, as described for one or more operations of FIG. 12;
- a return-link (RL) communication SW module 734 to preserve and/or maintain ongoing return link communications during inter-satellite handover operations (and during inter-beam handover operations), for example, as described for one or more operations of FIG. 12;
- a satellite handover SW module 735 to facilitate and control satellite handover operations, for example, as described for one or more operations of FIG. 12; and
- an antenna switching SW module 736 to dynamically adjust or switch the antenna 750 between different satellites, for example, as described for one or more operations of FIG. 12.

Each software module includes instructions that, when executed by the processor 720, cause the user terminal 700 to perform the corresponding functions. The non-transitory computer-readable medium of memory 730 thus includes instructions for performing all or a portion of the operations of FIG. 12.

The processor 720 may be any suitable one or more processors capable of executing scripts or instructions of one or more software programs stored in the UT 700 (e.g., within the memory 730). The processor 720 may execute the FL communication SW module 733 to preserve and/or maintain ongoing forward link communications during inter-satellite handover operations, for example, by communicating FL feedback messages and related HARQ information received from a serving satellite to a target satellite. The processor 720 may also execute the FL communication SW module 733 to preserve and/or maintain ongoing forward link communications during inter-beam handover operations, for example, by communicating an FL feedback message received by a scheduler for the serving beam (and related HARQ information) to a scheduler for the target beam.

The processor 720 may execute the RL communication SW module 734 to preserve and/or maintain an ongoing return link connection with an LEO satellite during inter-satellite handover operations, for example, so that the UT 700 can communicate control information or messages to the SAN 150 using the return link of the LEO satellite. In some aspects, the control information or messages may include (but not limited to) one or more of control data, user data, acknowledgements (such as RLC ack and TCP ack), HTTP get, HARQs, CQI reports, RRC configuration information, and so on). In some implementations, execution of the FL communication SW module 733 and the RL communication SW module 734 may be used to switch communications between beams of different satellites in the same satellite constellation (such as switching communications from a serving beam of LEO satellite 611A to a target beam of LEO satellite 611B). In addition, or in the alternative, execution of the FL communication SW module 733 and the RL communication SW module 734 may be used to switch communications between beams of different satellites belonging to different satellite constellations (such as switching communications from a serving beam of LEO satellite 611A to a target beam of MEO satellite 621B, switching communications from a serving beam of LEO satellite 611A to a target beam of GSO satellite 631B, or switching communications from a serving beam of MEO satellite 621A to a target beam of MEO satellite 621B).

The processor 720 may also execute the RL communication SW module 734 to preserve and/or maintain ongoing return link communications during inter-beam and inter-satellite handover operations, for example, by communicating RL data received by a scheduler for the serving beam (and related HARQ information) to a scheduler for the target beam. In some implementations, execution of the FL communication SW module 733 and the RL communication SW module 734 may be used to switch communications between different beams of the same satellite.

The processor 720 may execute the satellite handover SW module 735 to facilitate and control satellite handover operations. In some implementations, the processor 720 may execute the satellite handover SW module 735 to acquire, track, and lock a target satellite (such as a satellite with which the UT 700 does not yet have a communications link). The processor 720 may also execute the satellite handover SW module 735 to concurrently communicate with a serving satellite and a target satellite using a suitable time-division multiplexing (TDM) based transmission pattern.

The processor 720 may execute the antenna switching SW module 736 to dynamically adjust or switch the antenna 750 between different satellites (such as by tuning the transceiver 710 and calibrating the antenna 750 to the transmission frequency and timing used by the target satellite). In some aspects, one or more functions performed by execution of the antenna switching SW module 736 may be performed or implemented by the antenna switching circuit 760.

The signal processing system 740 may implement one or more protocol stacks. In some implementations, the one or more protocol stacks may operate in accordance with the Open Systems Interconnection (OSI) model (or another suitable protocol stack model). The OSI model is a seven-layer model developed by the International Standardization Organization (ISO) that describes how to interconnect any combination of network devices in terms of seven functional layers organized in a hierarchy. The higher in hierarchy an OSI layer is, the closer it is to an end user; the lower in hierarchy an OSI layer is, the closer it is to a physical channel From highest level of the hierarchy to lowest level of the hierarchy, the OSI Model includes the Application layer, the Presentation Layer, the Session Layer, the Transport Layer, the Network Layer, the Data-Link Layer, and the Physical Layer (not shown for simplicity). The Data-Link Layer is divided into logical link control (LLC) layer and the media access control (MAC) layer.

The PHY defines the relationship between the UT 700 and communication medium (such as the satellite link 755), and is responsible for modulating signals to be transmitted from the UT 700 and for demodulating signals received by the UT 700. The MAC layer may provide framing, encoding, and decoding, and is responsible for controlling access to the communication medium. In some aspects, the PHY and the MAC may provide block coding, convolutional coding, turbo coding, and outer coding for data received by the UT 700.

In some implementations, hybrid automatic repeat request (HARQ) processes are performed by the PHY and managed by the MAC layer of the UT 700. HARQ may be used by the UT 700 to request retransmission of data that was received in error. More specifically, HARQ allows the UT 700 to buffer and combine incorrectly received data (such as packets, frames, PDUs, MPDUs, and so on) to potentially reduce the number of retransmissions needed to properly reconstruct a particular unit of data. For example, if the UT 700 receives an incorrect unit of data from a network controller such as the SAN 150, the UT 700 may request retransmission of that particular unit of data. Rather than discard the incorrect unit of data, the UT 700 may store the incorrect unit of data (e.g., in a HARQ buffer) so that it can be combined with the retransmitted data, for example, thereby allowing the UT 700 to more quickly recover the correct unit of data.

For example, if both the original unit of data and the retransmitted data have errors, the UT 700 may combine the error-free portions of the original unit of data and the error-free portions of the retransmitted data to reconstruct the correct unit of data. The UT 700 may use return links provided by the LEO satellites 611A-611H to send HARQ feedback information to the network controller or the SAN 150. The HARQ feedback information may include an acknowledgement (ACK) to indicate that a corresponding unit or group of FL data was received correctly, or may include a negative acknowledgement (NACK) of FL data to indicate that the corresponding unit or group of FL data was received incorrectly (or not received at all).

The data-link layer is responsible for identifying network layer protocols, encapsulating packets, error checking, and frame synchronization. The network layer provides the functional and procedural means of transferring variable length data sequences such as datagrams or packets. The presentation, session, and transport layers may provide a communication plane for providing VoIP, web surfing, and other communication functionalities. The application layer may interact with software applications that implement or facilitate communications between devices.

In some implementations, one or more of the functions of the signal processing system 740 may be performed by executing software programs or instructions using the processor 720. In addition, or in the alternative, one or more of the functions of the signal processing system 740 may be performed by hardware under control of firmware, or may be performed by special purpose hardware such as application specific integrated circuits (ASIC), or field programmable gate arrays (FPGA). For example, in some implementations, one or more functions of the PHY of the signal processing system 740 may be implemented or performed by the transceiver 710.

Figure 8:
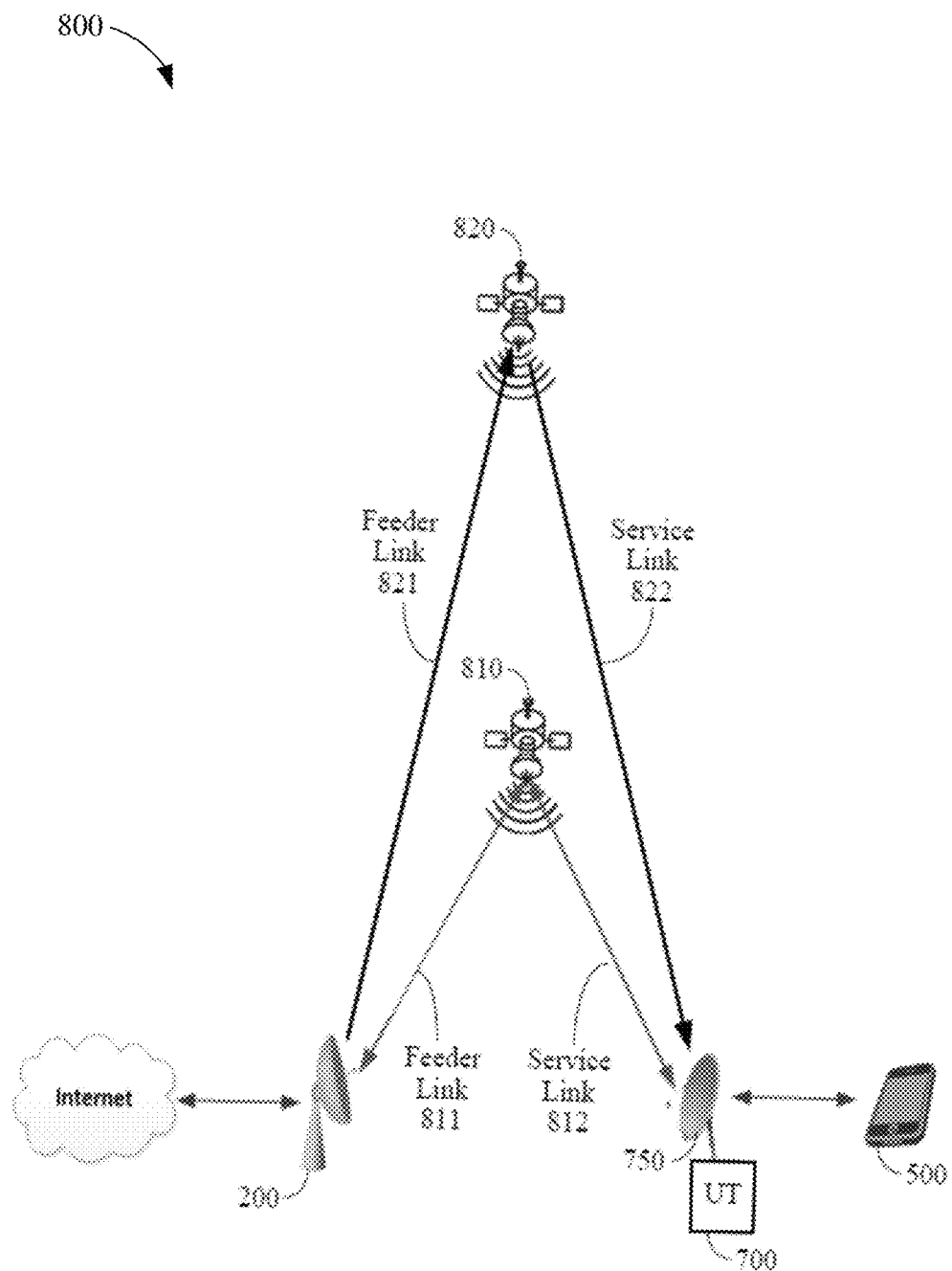
FIG. 8 shows a block diagram depicting a UT communicating with a first satellite and a second satellite that may belong to different satellite constellations.

FIG. 8 shows a block diagram 800 depicting a user terminal (UT) 700 communicating with a first satellite 810 and a second satellite 820. As shown in FIG. 8, the UT 700 (see also FIG. 7) may communicate with the UE 500 using any suitable communication protocol including, for example, cellular, Wi-Fi, Wi-Max, and Ethernet communications. The UT 700 may communicate with the gateway 200 via at least one of the first satellite 810 and the second satellite 820, and the gateway 200 may communicate with one or more other networks (such as the Internet, for example, as depicted in FIG. 1).

The first satellite 810 and the second satellite 820 may belong to different satellite constellations. In some implementations, the first satellite 810 may be one of the LEO satellites 611A-611H of FIG. 6, and the second satellite 820 may be one of the MEO satellites 621A-621C of FIG. 6. In other implementations, the first satellite 810 may be one of the LEO satellites 611A-611H of FIG. 6, and the second satellite 820 may be one of the GSO satellites 631A-631D of FIG. 6. In some other implementations, the first satellite 810 may be one of the MEO satellites 621A-621C of FIG. 6, and the second satellite 820 may be one of the GSO satellites 631A-631D of FIG. 6. In some other implementations, the first satellite 810 may be one of the LEO satellites 611A-611H of FIG. 6, and the second satellite 820 may an LEO satellite which belongs to another satellite constellation (such as different than the LEO satellite constellation 610 depicted in FIG. 6).

The first satellite 810 communicates with gateway 200 via a first feeder link 811, and communicates with the UT 700 via a first service link 812. The second satellite 820 communicates with gateway 200 via a second feeder link 821, and communicates with the UT 700 via a second service link 822. In some implementations, the first feeder link 811 and the first service link 812 associated with the first satellite 810 each include forward links and return links, and the second feeder link 821 and the second service link 822 associated with the second satellite 820 each include only forward links. For such implementations, the UT 700 may receive forward link communications from gateway 200 via either the first satellite 810 or the second satellite 820 (or both), and may transmit data to the gateway 200 using only the first satellite 810. In this manner, the second satellite 820 may provide additional forward link bandwidth for the satellite system, for example, to supplement the forward link capacity of the first satellite 810. In some aspects, the first satellite 810 and the second satellite 820 each have independent PHY cell IDs, for example, so that the UT 700 can direct transmissions to either the first satellite 810 or the second satellite 820 (and so that the first satellite 810 and the second satellite 820 can each determine whether it is the intended recipient of data transmitted from the UT 700).

The first satellite 810 provides a return link for transmissions from the UT 700 to the gateway 200, for example, that may be used by the UT 700 to transmit control information or messages that may include one or more of control data, user data, acknowledgements (such as RLC ack and TCP ack), HTTP get, HARQs, CQI reports, and RRC configuration information to the SAN 150. For example, if the UT 700 receives data in error from the first satellite 810, the UT 700 may use a HARQ process to request retransmission of the data received in error by transmitting a HARQ to the gateway 200 on the return link provided by the first satellite 810.

The second satellite 820 may not provide a return link for transmissions from the UT 700 to the gateway 200, and therefore may not facilitate HARQ processes or other error correction techniques for the UT 700. The lack of return link capabilities of the second satellite 820 may present challenges when the UT 700 receives data in error, particularly from the second satellite 820. In addition, because any ongoing HARQ processes with the first satellite 810 may be reset during a satellite handover operation from the first satellite 810 to the second satellite 820 (which may undesirably cause an increase in the number of retransmissions and thereby reduce the overall throughput of communications in the satellite system), switching communications of the UT 700 from the first satellite 810 to the second satellite 820 also may present challenges. For example, the lack of return link capabilities of the second satellite 820 may not afford the UT 700 an opportunity to transmit control information and messages (such as control data, user data, acknowledgements, HTTP get, and so on) to the SAN 150 via the second satellite 820).

In accordance with aspects of the present disclosure, the first satellite 810 (which may be one of the LEO satellites 611A-611H) may provide the anchor carrier signals for the satellite system, and the second satellite 820 (which may be one of the MEO satellites 621A-621C or one of the GSO satellites 631A-631D) may provide secondary carrier signals for the satellite system. In some implementations, the anchor carrier signals provided by the first satellite 810 may support both FL and RL transmissions to and from the UT 700, while the secondary carrier signals provided by the second satellite 820 may support only FL transmissions to the UT 700. The UT 700 transmits control information or messages to the SAN 150 using the RL anchor carrier signals of the first satellite 810. In some aspects, the control information or messages may include (but not limited to) one or more of control data, user data, acknowledgements (such as RLC ack and TCP ack), HTTP get, HARQs, CQI reports, RRC configuration information, and so on).

In some implementations, the UT 700 performs acquisition, access, registration, and paging operations with the first satellite 810 using the anchor carrier signals. Once the UT 700 establishes a connection with the SAN 150 via one or more serving beams of the first satellite 810, the SAN 150 may provide the UT 700 with ephemeris data and the PHY cell ID for the second satellite 820. In some aspects, the SAN 150 may also provide the UT 700 with ephemeris data and the PHY cell IDs for one or more of the LEO satellites 611A-611H, the MEO satellites 621A-621C, and the GSO satellites 631A-631D.

In some implementations, the UT 700 includes a single antenna 750 for communicating with both the first satellite 810 and the second satellite 820, and the bandwidth of the antenna 750 may include transmission frequencies used by both the first satellite 810 and the second satellite 820. In some aspects, the UT 700 may be configured to quickly re-position, re-orient, and/or tune its antenna 750 during handover operations between different types of satellites or between satellites belonging to different satellite constellations. In implementations for which the UT 700 includes only one transceiver 710, the transceiver 710 may be configured to decode modulated data received from either the first satellite 810 or the second satellite 820.

In some implementations, the satellite system may ensure that the UT 700 can receive and decode data received on the forward link from the second satellite 820 by specifying that traffic transmitted to the UT 700 on the forward link of the second satellite 820 has a target block error rate (BLER) greater than or equal to a threshold error rate ($TH_{error}$) for at least the first transmission. By initially transmitting forward link traffic to the UT 700 using a BLER greater than or equal to $TH_{error}$, the second satellite 820 may minimize or eliminate data reception errors at the UT 700, which in turn may reduce the frequency with which the UT 700 transmits data reception error messages (such as HARQ messages, radiolink controller (RLC) acknowledgements, HTTP Get messages, and so on) to the SAN 150 using RL resources of the first satellite 810. In some aspects, subsequent forward link traffic may be transmitted from the second satellite 820 to the UT 700 using a target BLER less than $TH_{error}$. In some aspects, the value of $TH_{error}$ may be approximately equal to $10^{-6}$. In other aspects, other suitable values may be used for $TH_{error}$.

In some implementations, the satellite system disclosed herein may employ outer codes when transmitting data on the forward links of the MEO satellites 621A-621C and the GSO satellites 631A-631D to avoid the error floor of turbo codes. In some aspects, the outer codes may be used on top of the turbo codes for forward link data transmissions to the UT 700 from the MEO satellites 621A-621C and the GSO satellites 631A-631D. For example, data transmissions having a target BLER on the order of $10^{-6}$ may have a target BLER that is less than the error floor of the turbo code, which is undesirable. To mitigate this problem, a satellite such as one of the MEO satellites 621A-621C or one of the GSO satellites 631A-631D may use concatenated coding in which a turbo code is used as an inner code and a BCH code is used as an outer code, for example, such that the resulting concatenated code has an error floor less than the value of $TH_{error}$ (such as less than approximately $10^{-6}$).

The UT 700 may initially access the satellite system by first acquiring the first satellite 810 (which may be one of the LEO satellites 611A-611H of FIG. 6). The UT 700 may obtain ephemeris data of the first satellite 810 in any suitable manner. In some implementations, the UT 700 may store ephemeris data of the first satellite 810 in a memory (such as memory 730 of FIG. 7). In other implementations, the UT 700 may obtain ephemeris data of the first satellite 810 from another UT, from another satellite, from the SAN 150, or from a combination thereof. In some aspects, the UT 700 may detect a satellite beam from the first satellite 810, search for a reference signal, run a frequency tracking loop, and decode satellite information blocks (SIBs) received from the first satellite 810. The SIBs may include ephemeris data for a number of the first satellites 810 (such as one or more of the LEO satellites 611A-611H).

In addition, or in the alternative, the SIBs transmitted from the first satellite 810 may include ephemeris data for a number of the second satellites 820 (such as one or more of the MEO satellites 621A-621C and/or one or more of the GSO satellites 631A-631D of FIG. 6). In some implementations, the SAN 150 may determine portions of ephemeris data for a number of the second satellites 820 (such as based on the location of the UT 700, elevation angles between the UT 700 and the second satellites 820, azimuth values between the UT 700 and the second satellites 820, and so on), and transmit the determined portions of the ephemeris data to the UT 700 via the forward link of the first satellite 810. In some aspects, the SAN 150 may send ephemeris data for a number of the second satellites 820 in the UT's field of view to the UT 700 using the forward link of the first satellite 810.

Once the UT 700 establishes a satellite link with the first satellite 810, the UT 700 may camp on the first satellite 810, may perform Idle Mode cell selection and re-selection on the first satellite 810, and may decode paging on the first satellite 810. The UT 700 may determine whether it is capable of receiving data from the second satellite 820, and may report this capability to the SAN 150, for example, using the return link of the first satellite 810. In some aspects, the UT 700 also may indicate its outer code capabilities to the SAN 150 (such as by using the return link of the first satellite 810).

Once the UT 700 has obtained or determined ephemeris data for the second satellite 820, the UT 700 may switch its forward link communications from the first satellite 810 to the second satellite 820. In this manner, the first satellite 810 may provide the anchor carrier signal for initial acquisition, access, registration, and paging operations for the UT 700, and the second satellite 820 may provide secondary carrier signals to increase the forward link capacity of the satellite system available for transmitting data to the UT 700 (and other UTs). In some implementations, the SAN 150 may determine whether (or when) to switch the forward link communications of the UT 700 from a serving beam of the first satellite 810 to a target beam of the second satellite 820.

In some implementations, the SAN 150 also may request channel information from the UT 700 and/or may request the UT 700 to measure channel quality information (CQI) of the forward links provided by one or more of the second satellites 820. The SAN 150 may transmit channel information requests or CQI measurement requests (or both) using unicast messages, multicast messages, or broadcast messages. In some aspects, the SAN 150 may identify the second satellites 820 for which the UT 700 is requested to measure CQI. In response to the request, the UT 700 may measure the CQI of the forward links (e.g., the target beam) of the identified second satellite(s) 820, and may transmit a CQI report to the SAN 150 using the return link of the first satellite 810. The SAN 150 may receive CQI reports from a number of UTs via the return links of one or more of the first satellites 810, and may selectively instruct the UT 700 to switch its forward link communications from the first satellite 810 to a selected one of the second satellites 820 based on a number of parameters (such as bandwidth and capacity information decoded from the received CQI reports, latency requirements or tolerances of data transmitted to the UT 700, the types or classifications of data transmitted to the UT 700, propagation delays associated with one or more of the satellites, and so on). In some aspects, the SAN 150 may instruct the UT 700 to switch its forward link communications by transmitting an RRC message to the UT 700 using the forward link of the first satellite 810, for example, in a manner similar to that used for providing coarse acquisition codes to the UT 700.

In some implementations, the UT 700 may concurrently communicate with the first satellite 810 and the second satellite 820 using a time-division multiplexing (TDM) based transmission pattern. To support half-duplex communication between the SAN 150 and a particular UT, transmissions on the forward service link 302F (such as from the SAN 150 to the UT) may be coordinated with transmissions on the return service link 301F (such as from the UT to the SAN 150). In some aspects, a given communications cycle (such as ~10 ms) may be subdivided into a number of forward link transmissions and a number of return link transmissions. For example, each forward link transmission may correspond with an individual subframe (e.g., a FL subframe) of data and/or control information sent from the SAN 150 to a particular UT. Similarly, each return link transmission may correspond with an individual subframe (e.g., an RL subframe) of data and/or control information sent from the particular UT to the SAN 150. The FL subframes and the RL subframes of a given communication cycle may collectively form a communication frame (or a "radio" frame). In other implementations, the SAN 150 may select one or more TDM based transmission patterns that allow the UT 700 to receive forward link data from the first satellite 810, the second satellite 820, and a third satellite (e.g., such as from a LEO satellite 611, a MEO satellite 621, and a GSO satellite 631).

Figure 9:
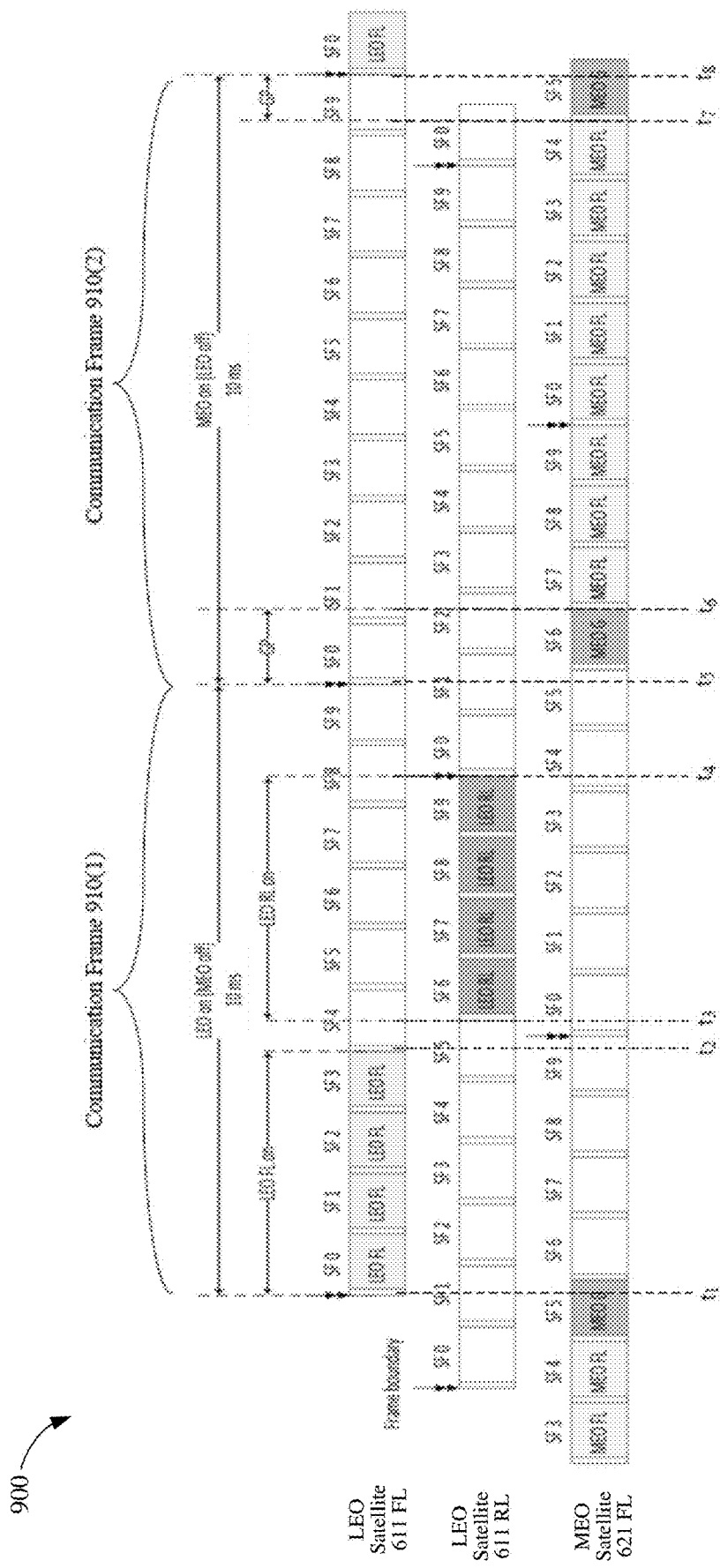
FIG. 9 shows an example timing diagram depicting an asymmetric distribution of forward link and return link subframes for a given communication frame.

FIG. 9 shows an example timing diagram 900 depicting an asymmetric distribution of FL subframes and RL subframes for two communication frames 910(1) and 910(2). More specifically, the timing diagram 900 shows a UT switching between the forward links of an LEO satellite 611 and an MEO satellite 621 while maintaining return link communications with the LEO satellite 611. For the example depicted in FIG. 9, each of the communication frames 910(1) and 910(2) has a duration of 10 milli-seconds (ms), and may be subdivided into ten subframe slots SF0-SF9 (such that each of the subframe slots SF0-SF9 has a duration of 1 ms). Each of the subframe slots SF0-SF9 may be occupied by a FL subframe, an RL subframe, or left unassigned. In some aspects, the two communication frames 910(1) and 910(2) may correspond to a TDM transmission pattern having a period of 20 ms.

A guard period (GP) may be inserted between the first communication frame 910(1) and the second communication frame 910(2). In some aspects, the guard period may occur during transmission of the second communication frame 910(2). The guard period may be used when switching UT communications between satellites that belong to different satellite constellations (such as when switching forward link communications of a UT from the LEO satellite 611 to the MEO satellite 621, when switching forward link communications of a UT from the LEO satellite 611 to a GSO satellite 631, when switching forward link communications of a UT from the MEO satellite 621 to a GSO satellite 631, and so on). Thus, for at least some implementations, there are no data transmissions during the guard period, for example, to allow the UT time to switch between receiving forward link traffic and transmitting return link traffic. It is noted that the 2 service link delays shown in FIG. 9 are independent and asynchronous.

During the time period associated with transmission of the first communication frame 910(1), the LEO satellite 611 either transmits or receives data, and the MEO satellite 621 does not transmit data (e.g., the LEO satellite 611 is "on" and the MEO satellite 621 is "off"). For the example of FIG. 9, the LEO satellite 611 transmits data to the UT on its forward link via subframes SF0-SF3 between times $t_1$ and $t_2$, switches from a transmission mode to a reception mode between times $t_2$ and $t_3$, and receives data from the UT on its return link via subframes SF6-SF9 between times $t_3$ and $t_4$. The transmission period of the first communication frame 910(1) ends at time $t_5$, which is followed by a guard period between times $t_5$ and $t_6$. The guard period may be used by the SAN 150 to switch forward link communications from the LEO satellite 611 to the MEO satellite 621. In some aspects, the MEO satellite 621 may prepare for transmission operations during the guard period.

At time $t_6$, the time period associated with transmission of the second communication frame 910(2) begins, and the MEO satellite 621 transmits data to the UT on its forward link via subframes SF7-SF9 and subframes SF0-SF4 of the second communication frame 910(2) between times $t_6$ and $t_7$. The LEO satellite 611 may be inactive (or at least not transmitting data to the UT) between times $t_6$ and $t_7$. During a second guard period between times $t_7$ and $t_8$, the SAN 150 switches forward link communications from the MEO satellite 621 to the LEO satellite 611. Thereafter, at time $t_8$, the LEO satellite 611 begins transmitting data to the UT on its forward link via subframes SF0-SF3 during a time period associated with transmission of a third communication frame (not shown for simplicity).

Some example TDM-based transmission patterns are shown below in Table 1, where "S1" denotes the first satellite 810 (such as the LEO satellite 611), "S2" denotes the second satellite 820 (such as the MEO satellite 621), and "S3" denotes a third satellite (such as the GSO satellite 631):

TABLE 1

| TDM Pattern | Periodicity | S1 (LEO) | S2 (MEO) | S3 (GSO) |
| --- | --- | --- | --- | --- |
| P1 | 10 ms | 10 ms | 0 ms | 0 ms |
| P2 | 20 ms | 10 ms | 10 ms | 0 ms |

TABLE 1-continued

| TDM Pattern | Periodicity | S1 (LEO) | S2 (MEO) | S3 (GSO) |
|---|---|---|---|---|
| P3 | 30 ms | 10 ms | 0 ms | 20 ms |
| P4 | 60 ms | 10 ms | 20 ms | 30 ms |

The above examples may use 10 ms-long communication frames (e.g., transmission slots) for transmitting data to the UT 700, and may serve either a full-duplex UT or a half-duplex UT. In addition, the 10 ms-long communication frames also may allow the UT 700 to periodically transmit information (such as control data, user data, RLC acknowledgements, TCP acknowledgements, HTTP GETs, and so on) on the return link of the first satellite 810, which in turn may ensure that information provided by the UT 700 is received by the SAN 150.

As indicated in Table 1, transmission pattern P1 has a period of 10 ms, and is allocated only to the LEO satellite 611. In some implementations for which the UT 700 operates as a half-duplex device, a first portion of each period of transmission pattern P1 may be allocated for forward link transmissions from the LEO satellite 611 to the UT 700, and a second portion of the period of transmission pattern P1 may be allocated for return link transmissions from the UT 700 to the LEO satellite 611. In other implementations for which the UT 700 operates as a full-duplex device, the 10 ms allocated to the LEO satellite 611 may be used for both forward link transmissions and return link transmissions between the UT 700 and the LEO satellite 611. The return link transmissions may include information such as, for example, control data, user data, RLC acknowledgements, TCP acknowledgements, HTTP GETs, and the like.

Transmission pattern P2 has a period of 20 ms, and allocates forward link resources of the LEO satellite 611 and the MEO satellite 621 to the UT 700. More specifically, the first 10 ms of each period of transmission pattern P2 is allocated to the LEO satellite 611, and the last 10 ms of each period of transmission pattern P2 is allocated to the MEO satellite 621. In some implementations for which the UT 700 operates as a half-duplex device, a first portion of the 10 ms allocated to the LEO satellite 611 may be used for forward link transmissions from the LEO satellite 611 to the UT 700, and a second portion of the 10 ms allocated to the LEO satellite 611 may be used for return link transmissions from the UT 700 to the LEO satellite 611. In other implementations for which the UT 700 operates as a full-duplex device, the 10 ms allocated to the LEO satellite 611 may be used for both forward link transmissions and return link transmissions between the UT 700 and the LEO satellite 611. The return link transmissions may include information (such as control data, user data, RLC acknowledgements, TCP acknowledgements, HTTP GETs, and the like) pertaining to the LEO satellite 611, the MEO satellite 621, or both. In some aspects, transmission pattern P2 may correspond to the example timing diagram 900 of FIG. 9.

Transmission pattern P3 has a period of 30 ms, and allocates forward link resources of the LEO satellite 611 and the GSO satellite 631 to the UT 700. More specifically, the first 10 ms of each period of transmission pattern P3 is allocated to the LEO satellite 611, and the last 20 ms of each period of transmission pattern P3 is allocated to the GSO satellite 631. In some implementations for which the UT 700 operates as a half-duplex device, a first portion of the 10 ms allocated to the LEO satellite 611 may be used for forward link transmissions from the LEO satellite 611 to the UT 700, and a second portion of the 10 ms allocated to the LEO satellite 611 may be used for return link transmissions from the UT 700 to the LEO satellite 611. In other implementations for which the UT 700 operates as a full-duplex device, the 10 ms allocated to the LEO satellite 611 may be used for both forward link transmissions and return link transmissions between the UT 700 and the LEO satellite 611. The return link transmissions may include information (such as control data, user data, RLC acknowledgements, TCP acknowledgements, HTTP GETs, and the like) pertaining to the LEO satellite 611, the GSO satellite 631, or both.

Transmission pattern P4 has a period of 60 ms, and allocates forward link resources of the LEO satellite 611, the MEO satellite 621, and the GSO satellite 631 to the UT 700. More specifically, the first 10 ms of each period of transmission pattern P4 is allocated to the LEO satellite 611, the next 20 ms of each period of transmission pattern P4 is allocated to the MEO satellite 621, and the last 30 ms of each period of transmission pattern P4 is allocated to the GSO satellite 631. In some implementations for which the UT 700 operates as a half-duplex device, a first portion of the 10 ms allocated to the LEO satellite 611 may be used for forward link transmissions from the LEO satellite 611 to the UT 700, and a second portion of the 10 ms allocated to the LEO satellite 611 may be used for return link transmissions from the UT 700 to the LEO satellite 611. In other implementations for which the UT 700 operates as a full-duplex device, the 10 ms allocated to the LEO satellite 611 may be used for both forward link transmissions and return link transmissions between the UT 700 and the LEO satellite 611. The return link transmissions may include information (such as control data, user data, RLC acknowledgements, TCP acknowledgements, HTTP GETs, and the like) pertaining to the LEO satellite 611, the MEO satellite 621, the GSO satellite 631, or any combination thereof.

The SAN 150 (or other suitable network controller) may use any number of TDM-based transmission patterns (such as the four example TDM-based transmission patterns P1-P4 indicated above) to dynamically allocate forward link resources of satellite systems disclosed herein to the UT 700. In some implementations, the SAN 150 may select a particular TDM transmission pattern for the UT 700 based at least in part on latency requirements or tolerances of forward link traffic associated with the UT 700, the relative propagation delays of the LEO satellites 611, the MEO satellites 621, and the GSO satellites 631, or any combination thereof. As described above, MEO satellites 621 orbit the Earth at much greater altitudes than the LEO satellites 611, and may have much longer signal propagation delays than the LEO satellites 611. The GSO satellites 631 may offer greater bandwidth and better signal-to-noise ratios (SNRs) than the LEO satellites 611 or the MEO satellites 621, yet have much longer signal propagation delays than the LEO satellites 611 and the MEO satellites 621. Thus, in some aspects, the forward link resources of the LEO satellite 611 may be used for low-latency traffic, the forward link resources of the MEO satellite 621 may be used for traffic that can tolerate longer latencies, and the forward link resources of the GSO satellite 631 may be used for traffic that can tolerate even longer latencies.

For example, if a first user associated with the UT 700 is receiving low-latency voice communications, a second user associated with the UT 700 is browsing the Internet, and a third user associated with the UT 700 is receiving streaming video, then the SAN 150 may allocate 10 ms forward link transmission slots of the LEO satellite 611 to the first user, may allocate 20 ms forward link transmission slots of the MEO satellite 621 to the second user, and may allocate 30 ms forward link transmission slots of the GSO satellite 631 to the third user. In some aspects, the SAN 150 may allocate the forward link transmission slots of the LEO satellite 611 to the first user because the LEO satellite 611 has the lowest propagation delays and may therefore be most suitable for low-latency traffic (and other high-priority data); the SAN 150 may allocate the forward link transmission slots of the MEO satellite 621 to the second user because Internet browsing can tolerate longer propagation delays than real-time voice traffic; and the SAN 150 may allocate the forward link transmission slots of the GSO satellite 631 to the third user because streaming video may tolerate the longer propagation delays associated with the GSO satellite 631.

The timelines of the LEO satellites 611A-611H, the MEO satellites 621A-621C, and/or the GSO satellites 631A-631D may drift over time relative to each other. The SAN 150 can store ephemeris data for all the satellites in the satellite system and the positions of the UTs on Earth, and may determine the service link delays between the given UT and each of a selected LEO satellite, MEO satellite, and GSO satellite. In some aspects, the SAN 150 may keep track of the service link delays (as well as the relative changes between them), for example, so that the UT 700 switches forward link communications from the LEO satellite 611 to either the MEO satellite or the GSO satellite during the "off time" of the LEO satellite 611. The SAN 150 may dynamically track the relative timing slew of the selected LEO satellite, the selected MEO satellite, and the selected GSO satellite, and may schedule forward link traffic using subframes of the MEO and GSO satellites occurring during the off time of the LEO satellite (less a guard period and timing offsets $t_{off1}$ and $t_{off2}$ before and after the guard period, respectively). In this manner, the SAN 150 (or a scheduler associated with the SAN 150 or another suitable network controller) may schedule the transmission of forward link data from non-LEO satellites in subframes at times during the "off periods" of the LEO satellite.

In some aspects, the UT 700 can report a capability parameter (denoted herein as the timeToRepointAndReacquire) indicating an amount of time associated with repositioning its antenna 750 and re-acquiring the physical layer loops to switch its communications from one satellite to another satellite. The SAN 150 (or a scheduler associated with the SAN 150) may ensure that the durations of $t_{off1}$ and $t_{off2}$ are greater than the duration of the timeToRepointAndReacquire. If a UT is configured with a hybrid communication pattern, the power control system of the UT is enabled during forward link transmissions using an LEO satellite and is disabled during forward link transmissions using an MEO satellite or a GEO satellite.

The UT 700 may be served by a LEO satellite 611, a MEO satellite 621, and a GSO satellite 631 based on a TDM transmission pattern that dynamically allocates forward link resources available to the UT 700 between the LEO satellite 611, the MEO satellite 621, and the GSO satellite 631. In implementations for which the MEO satellite 621 and the GSO satellite 631 do not provide return link resources, the UT 700 may maintain the return link connection with the LEO satellite 611 even when its forward link is served by the MEO satellite 621 and/or the GSO satellite 631. In this manner, the SAN 150 may use the return link of the LEO satellite 611 to complete handover operations between non-LEO satellites. In addition, or in the alternative, the SAN 150 may use the forward link resources of the LEO satellite 611 to initiate or trigger handover operations between non-LEO satellites.

Referring also to FIG. 6, the LEO satellites 611A-611H orbit the Earth at much lower altitudes than the MEO satellites 621A-621C, and are visible to a UT 700 for much shorter time periods than the MEO satellites 621A-621C (or the GSO satellites 631A-631D). As such, handover operations between LEO satellites 611A-611H may occur much more frequently than handover operations between MEO satellites 621A-621C (or between GSO satellites 631A-631D). In some implementations, the UT 700 may switch its service link connection between LEO satellites 611A-611H a multitude of times during the service period of one of the MEO satellites 621A-621C. For example, in one implementation, the UT 700 may switch its service link connection between LEO satellites 611A-611H every 3 minutes, and may switch its forward link connection between MEO satellites 621A-621C every 35-40 minutes.

In some implementations, handover messages used during handover operations between LEO satellites 611A-611H may include a new field containing information pertaining to forward link offloading capabilities of the MEO satellites 621A-621C and GSO satellites 631A-631D. This new field may be used to ensure that forward link communications are switched between MEO satellites and/or GSO satellites at the same time as handover operations between LEO satellites. In some aspects, this new field includes the Physical cell ID and carrier frequency of the MEO and GSO satellites, for example, so that a given UT can measure the forward link channel conditions of the MEO and GSO satellites and then provide a CQI report to the SAN using the return link of the LEO satellite. In addition, or in the alternative, the given UT may measure the signal strengths and/or the SNRs of the forward links of the MEO and GSO satellites and then transmit a measurement report containing the measured signal strengths and/or SNRs to the SAN 150 using the return link of the LEO satellite.

Figure 10A:
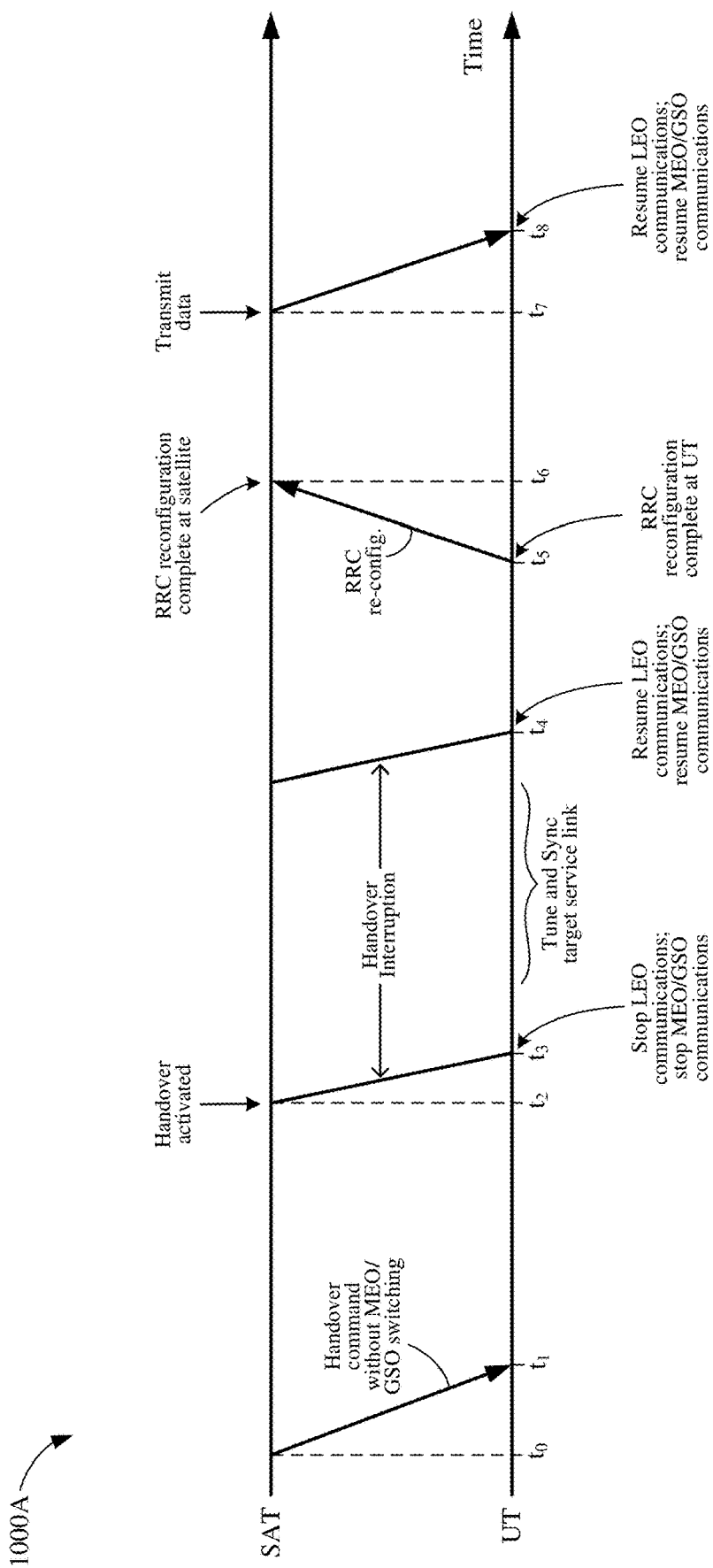
FIG. 10A shows a timing diagram depicting an example handover operation from a first LEO satellite to a second LEO satellite without switching forward link communications between non-LEO satellites.

FIG. 10A shows a timing diagram 1000A depicting an example handover operation from a first LEO satellite to a second LEO satellite without switching forward link resources between non-LEO satellites. For the example of FIG. 10A, the first and second LEO satellites may be two of the LEO satellites 611A-611H, and the non-LEO satellite may be one of the MEO satellites 621A-621C or one of the GSO satellites 631A-631D. Prior to time to, the SAN 150 transmits a handover command on the FL of the first LEO satellite. The handover command, which is received by the first LEO satellite at time to and received by the UT at time $t_1$, may instruct the non-LEO and LEO satellites to cease transmission and reception operations. In some implementations, the handover command may contain information of the non-LEO satellite to which forward link communications are offloaded from the LEO satellites. The information may include (but is not limited to) ephemeris data of the non-LEO satellite, the physical cell ID of the non-LEO satellite, and the carrier frequency of the non-LEO satellite.

The handover operation is activated at the first LEO satellite at time $t_2$, and is activated at the UT at time $t_3$. In response thereto, the non-LEO and LEO satellites cease transmission and reception operations on the service links with the UT. After time $t_3$, the UT may begin tuning its transceiver and calibrating its antenna to the transmission frequency and timing used by the second LEO satellite (e.g., to synchronize the UT with the second LEO satellite). The handover operation completes at time $t_4$, after which the SAN 150 allows the non-LEO and LEO satellites to resume transmission and reception operations. During the satellite handover operation between times $t_2$ and $t_4$, the service links between the UT and the satellites may be interrupted (such that the UT does not transmit or receive data during the satellite handover interruption period). The UT completes its RRC reconfiguration at time $t_5$, and the second LEO satellite completes its RRC reconfiguration at time $t_6$. The non-LEO satellite transmits data on its forward link to the UT at time $t_7$, and the UT receives the transmitted forward link data at time $t_8$. In addition, or in the alternative, the second LEO satellite may begin transmitting data on its forward link to the UT at time $t_7$.

Figure 10B:
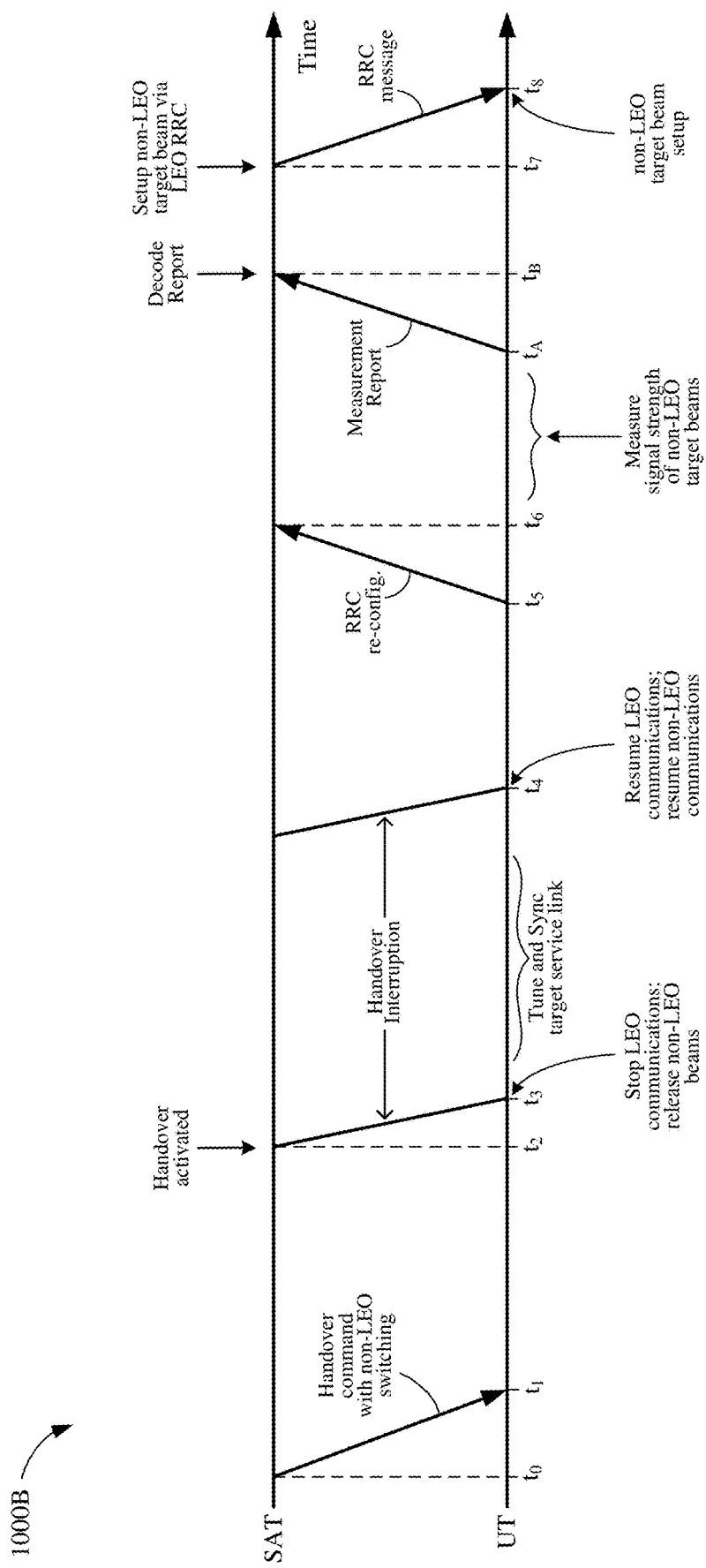
FIG. 10B shows a timing diagram depicting an example handover operation from a first LEO satellite to a second LEO satellite aligned with a handover operation between non-LEO satellites.

In some implementations, handover operations between MEO satellites (or GSO satellites) can be aligned with handover operations between LEO satellites, which may obviate the need for independent RRC reconfiguration messages for beam releases of the MEO and GSO satellites. FIG. 10B shows a timing diagram 1000B depicting an example handover operation from a first LEO satellite to a second LEO satellite that is aligned with a handover operation between non-LEO satellites. For the example of FIG. 10B, the first and second LEO satellites may be two of the LEO satellites 611A-611H, and the non-LEO satellites may be two of the MEO satellites 621A-621C or two of the GSO satellites 631A-631D.

The handover command, which is received by the first LEO satellite at time to and received by the UT at time $t_1$, may instruct the non-LEO and LEO satellites to cease transmission and reception operations. In some implementations, the handover command may contain information pertaining to both the LEO handover operation and the non-LEO handover operation. The information may include (but is not limited to) ephemeris data of the target non-LEO satellite, the physical cell ID of the target non-LEO satellite, and the carrier frequency of the target non-LEO satellite.

The handover operation is activated at the LEO satellites and the non-LEO satellites at time $t_2$, and is activated at the UT at time $t_3$. In response thereto, the LEO satellites and non-LEO satellites cease transmission and reception operations on the service links with the UT. After time $t_3$, the UT may begin tuning its transceiver and calibrating its antenna to the transmission frequency and timing used by the second LEO satellite (e.g., to synchronize the UT with the second LEO satellite). The handover operation completes at time $t_4$, after which the SAN 150 allows the satellites to resume transmission and reception operations. During the satellite handover operation between times $t_2$ and $t_4$, the service links between the UT and the satellites may be interrupted (such that the UT does not transmit or receive data during the satellite handover interruption period).

The UT completes its RRC reconfiguration at time $t_5$, and the second LEO satellite completes its RRC reconfiguration at time $t_6$. After time $t_6$, the UT may measure the signal strength of the target beam of the second non-LEO satellite. At time $t_A$, the UT transmits a measurement report (on the RL of the second LEO satellite) containing the measured signal strength, which is received by the SAN 150 at time $t_B$. In some implementations, the SAN 150 may use measured signal strength information to determine whether (or when) to switch forward link communications of the non-LEO satellite. Thereafter, the SAN 150 transmits an RRC message that activates the target beam of the second non-LEO satellite at time $t_7$. The UT may receive the RRC message by time $t_8$. In some implementations, the SAN 150 may transmit the RRC message using the forward link of the second LEO satellite.

By aligning handover operations between non-LEO satellites with handover operations between LEO satellites, the SAN 150 may use the return link of the serving LEO satellite to receive control messages from the UT needed to complete the non-LEO handover operation. In some implementations, the timing of handover operations between non-LEO satellites may be adjusted (e.g., delayed) to align with handover operations between LEO satellites.

Figure 11:
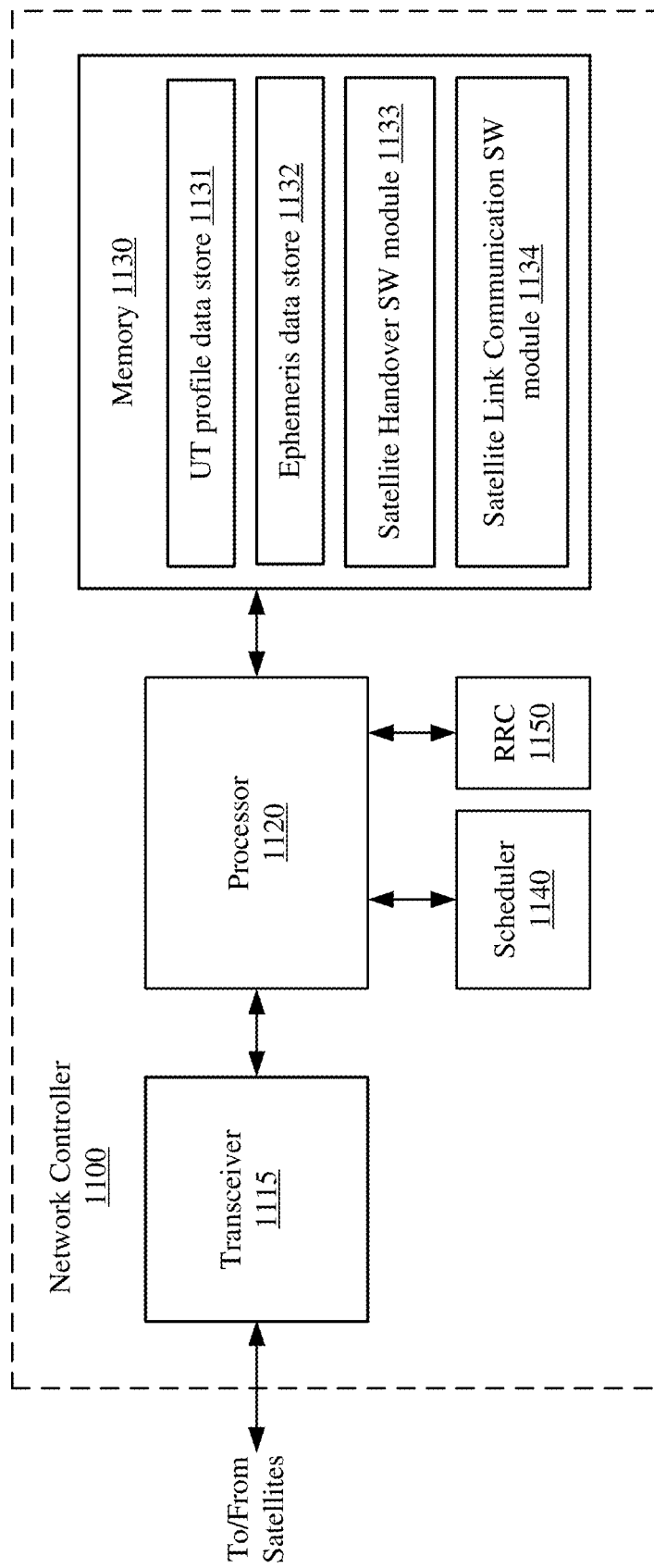
FIG. 11 shows a block diagram of an example controller.

FIG. 11 shows a block diagram of an example network controller 1100 in accordance with example implementations. The network controller 1100, which may be one implementation of the SAN 150 of FIG. 1, may include at least an antenna (not shown for simplicity), a transceiver 1115, a processor 1120, a memory 1130, a scheduler 1140, and a radio resource control (RRC) 1150. The transceiver 1115 may be used to transmit signals to and receive signals from a number of UTs (such as UT 400 or UT 700) via one or more satellites (such as one or more of the LEO satellites 611A-611H, one or more of the MEO satellites 621A-621C, one or more of the GSO satellites 631A-631D, or any combination thereof). Although not shown in FIG. 11 for simplicity, the transceiver 1115 may include any suitable number of transmit chains and/or may include any suitable number of receive chains.

The scheduler 1140 may schedule FL resources and RL resources of a satellite, a constellation of satellites, or a satellite system for a number of UTs. In some implementations, the scheduler 1140 may schedule, control, or otherwise manage satellite handover operations for a number of UTs. In some aspects, the scheduler 1140 may determine when a UT is to switch its FL communications from a serving satellite to a target satellite, and may control FL transmissions of the serving satellite and the target satellite. The scheduler 1140 may also schedule grants of RL resources to a UT by transmitting one or RL grants to the UT, and may select the size of the granted RL resources based on buffer status reports (BSRs) received from the UT. In some aspects, the scheduler 1140 may control or manage each beam of a satellite during inter-beam handover operations.

The RRC 1150 may transmit RRC configuration messages to a UT during inter-beam handovers, during inter-satellite handovers, or both. In some implementations, the RRC configuration messages may include timing information associated with switching the UT's forward link communications from a serving satellite to a target satellite (such as from the LEO satellite 611 to the MEO satellite 621, or from the MEO satellite 621 to the LEO satellite 611). The RRC configuration messages may also be used to reconfigure and/or reestablish communications between the SAN 150 and the UT resulting from inter-satellite handovers (as well as from inter-beam handovers).

The processor 1120 is coupled to the transceiver 1115, to the memory 1130, to the scheduler 1140, and to the RRC 1150. The processor 1120 may be any suitable one or more processors capable of executing scripts or instructions of one or more software programs stored in the network controller 1100 (such as within the memory 1130).

The memory 1130 may include a UT profile data store 1131 and an ephemeris data store 1132. The UT profile data store 1131 may store profile information for a plurality of UTs. The profile information for a particular UT may include, for example, outer code capabilities of the UT, a capability of the UT to transmit and receive data from non-LEO satellites (such as MEO satellites and GSO satellites), the transmission history of the UT, location information of the UT, and any other suitable information describing or pertaining to the operation of the UT.

The ephemeris data store 1132 may store ephemeris data for any number of satellites belonging to any number of different satellite constellations. In some implementations, the ephemeris data store 1132 may store ephemeris data for the LEO satellites 611A-611H, the MEO satellites 621A-621C, and the GSO satellites 631A-631D of FIG. 6.

The memory 1130 may also include a non-transitory computer-readable storage medium (such as one or more nonvolatile memory elements, such as EPROM, EEPROM, Flash memory, a hard drive, and so on) that may store the following software modules (SW):
 a satellite handover SW module 1133 to facilitate and control satellite handover operations, for example, as described for one or more operations of FIG. 12; and
 a satellite link communication SW module 1134 to preserve and/or maintain ongoing RL communications during satellite handover operations, for example, as described for one or more operations of FIG. 12.

Each software module includes instructions that, when executed by the processor 1120, cause the network controller 1100 to perform the corresponding functions. The non-transitory computer-readable medium of memory 1130 thus includes instructions for performing all or a portion of the operations of FIG. 12.

The processor 1120 may execute the satellite handover SW module 1133 to facilitate and control satellite handover operations. In some implementations, execution of the satellite handover SW module 1133 may be used to switch forward link communications of a UT between different satellites (such as switching communications from LEO satellite 611A to LEO satellite 611B). Execution of the satellite handover SW module 1133 may also be used to switch forward link communications of a UT between different beams of a satellite.

The processor 1120 may execute the satellite link communication SW module 1134 to preserve and/or maintain ongoing forward link communications during inter-satellite handover operations, for example, by receiving control messages (such as HARQ messages) and feedback messages (such as CQI reports) from UTs on the return links of one or more LEO satellites. Execution of the satellite link communication SW module 1134 may also preserve and/or maintain ongoing return link communications during satellite handover operations, for example, so that a UT can transmit control messages and feedback messages to the SAN using the return link of a LEO satellite when receiving forward link data from a non-LEO satellite or when switching its forward link communications between different satellites. In this manner, the forward link communications of a UT may be dynamically switched between different satellites while maintaining a return link connection with the SAN 150 via the LEO satellite.

FIG. 12 shows an illustrative flow chart depicting an example satellite handover operation 1200. The example operation 1200 may be performed by the SAN 150 of FIG. 1 and is described with respect to FIGS. 7-9 and 10A-10B. However, it is to be understood that the operation 1200 may be performed by suitable components of the SAN 150 or another suitable network controller. The example operation 1200, which may be used to switch forward link communications of a user terminal between different satellites that may belong to different satellite constellations, is described with respect to switching the forward link communications of UT 700 between the first satellite 810 and the second satellite 820 of FIG. 8. For purposes of discussion herein, the first satellite 810 is a LEO satellite (such as one of the LEO satellites 611A-611H of FIG. 6) and the second satellite 820 is a non-LEO satellite (such as one of the MEO satellites 621A-621C or one of the GSO satellites 631A-631D of FIG. 6). One of ordinary skill in the art will readily understand that the example operation 1200 may be used to switch forward link communications of any suitable user terminal between any number of different satellites.

The SAN 150 transmits first data to the user terminal on a forward link of the first satellite 810 (1201). In some implementations, the LEO satellite may transmit data to the user terminal using a first portion of a first communication frame (e.g., using subframes SF0-SF3 of the first communication frame 910(1) of FIG. 9). In some aspects, the return link of the LEO satellite may be inactive during transmission of forward link data to the user terminal by the LEO satellite. In addition, or in the alternative, the second satellite 820 may not provide a return link for the user terminal.

The SAN 150 transmits time-division multiplexing (TDM) configuration information to the user terminal on the forward link of the first satellite, the TDM configuration information specifying a TDM transmission pattern for forward link communications to the user terminal from at least the first and second satellites (1202). In some implementations, the specified TDM transmission pattern is based on one or more of latency requirements of data transmitted to the user terminal, a type or classification of data transmitted to the user terminal, and propagation delays of the first and second satellites. In addition, or in the alternative, the specified TDM transmission pattern may configure the user terminal to receive forward link communications from a low-earth orbit (LEO) satellite during a first portion of a TDM transmission period, to receive forward link communications from a medium-earth orbit (MEO) satellite during a second portion of a TDM transmission period, and to receive forward link communications from a geosynchronous orbit (GSO) satellite during a third portion of a TDM transmission period.

The SAN 150 switches forward link communications of the user terminal from the first satellite to the second satellite during a handover operation (1203). In some implementations, the SAN 150 may cause the user terminal to switch its forward link communications from the first satellite to the second satellite by transmitting a radio controller circuit (RRC) message to the user terminal using the forward link of the first satellite.

The SAN 150 transmits second data to the user terminal on a forward link of the second satellite 820 after the handover operation (1204). In some implementations, the non-LEO satellite may transmit data to the user terminal using a number of subframes of a second communication frame (e.g., using subframes SF7-SF9 and subframes SF0-SF4 of the second communication frame 910(2) of FIG. 9). The forward link of the first satellite 810 may be disabled during transmission of the second communication frame on the forward link of the second satellite 820. In some aspects, the non-LEO satellite may transmit the second data using a concatenated code including a turbo code as an inner code and including a Bose-Chaudhuri-Hocquenghem (BCH) code as an outer code. In addition, or in the alternative, the second data may be transmitted with a BLER greater than or equal to a value, for example, to reduce data reception errors of the second data at the user terminal.

The SAN 150 receives one or more control messages from the user terminal on the return link of the first satellite 810 after the handover operation (1205). In some implementations, the user terminal may measure a signal strength of a target beam of the second satellite (e.g., the non-LEO satellite), and may embed the measured signal strength in the one or more control or data messages transmitted to the SAN 150 using the return link of the first satellite (e.g., the LEO satellite). In addition, or in the alternative, the user terminal may transmit HARQ messages to the SAN 150 using the return link of the LEO satellite.

The SAN 150 maintains the return link between the first satellite 810 and the user terminal before and after the handover operation (1206). In this manner, the user terminal may use the return link of the LEO satellite to transmit control messages and data to the SAN 150 while the user terminal has a forward link connection with the non-LEO satellite.

Figure 13:
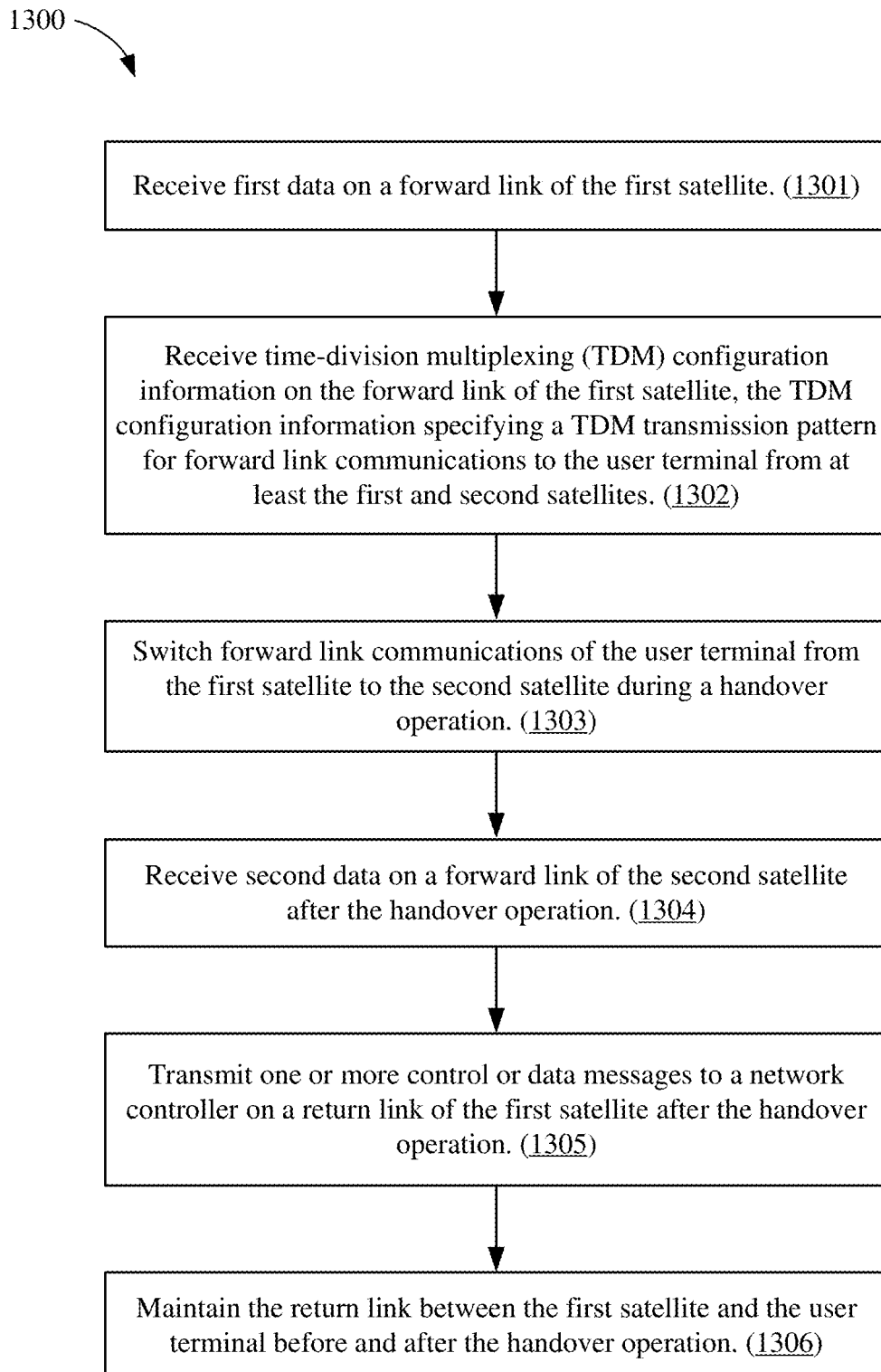
FIG. 13 shows an illustrative flow chart depicting another example satellite handover operation.

FIG. 13 shows an illustrative flow chart depicting another example satellite handover operation 1300. The example operation 1300 may be performed by the user terminal (UT) 700 of FIG. 7 and is described with respect to FIGS. 7-9 and 10A-10B. However, it is to be understood that the operation 1300 may be performed by another suitable user terminal. The example operation 1300 may be used to switch forward link communications of a user terminal between a first satellite and a second satellite that may belong to different satellite constellations. For purposes of discussion herein, the first satellite 810 is a LEO satellite (such as one of the LEO satellites 611A-611H of FIG. 6) and the second satellite 820 is a non-LEO satellite (such as one of the MEO satellites 621A-621C or one of the GSO satellites 631A-631D of FIG. 6). One of ordinary skill in the art will readily understand that the example operation 1300 may be used to switch forward link communications of any suitable user terminal between any number of different satellites.

The user terminal 700 receives data on a forward link of the first satellite (1301). In some implementations, the LEO satellite may transmit data to the user terminal using a first portion of a first communication frame (e.g., using subframes SF0-SF3 of the first communication frame 910(1) of FIG. 9). In some aspects, the return link of the LEO satellite may be inactive during transmission of forward link data to the user terminal by the LEO satellite. In addition, or in the alternative, the second satellite does not provide a return link for the user terminal.

The user terminal 700 receives time-division multiplexing (TDM) configuration information on the forward link of the first satellite, the TDM configuration information specifying a TDM transmission pattern for forward link communications to the user terminal from at least the first and second satellites (1302). In some implementations, the specified TDM transmission pattern is based on one or more of latency requirements of data transmitted to the user terminal, a type or classification of data transmitted to the user terminal, and propagation delays of the first and second satellites. In addition, or in the alternative, the specified TDM transmission pattern may configure the user terminal to receive forward link communications from a low-earth orbit (LEO) satellite during a first portion of a TDM transmission period, to receive forward link communications from a medium-earth orbit (MEO) satellite during a second portion of a TDM transmission period, and to receive forward link communications from a geosynchronous orbit (GSO) satellite during a third portion of a TDM transmission period.

The user terminal 700 switches forward link communications from the first satellite to the second satellite during a handover operation (1303). In some implementations, the SAN 150 may cause the user terminal to switch its forward link communications from the first satellite to the second satellite by transmitting a radio controller circuit (RRC) message to the user terminal using the forward link of the first satellite.

The user terminal 700 receives second data on a forward link of the second satellite after the handover operation (1304). In some implementations, the non-LEO satellite may transmit data to the user terminal using a number of subframes of a second communication frame (e.g., using subframes SF7-SF9 and subframes SF0-SF4 of the second communication frame 910(2) of FIG. 9). The forward link of the first satellite may be disabled during transmission of the second communication frame on the forward link of the second satellite. In some aspects, the non-LEO satellite may transmit the second data using a concatenated code including a turbo code as an inner code and including a Bose-Chaudhuri-Hocquenghem (BCH) code as an outer code. In addition, or in the alternative, the second data may be transmitted with a BLER greater than or equal to a value, for example, to reduce data reception errors of the second data at the user terminal.

The user terminal 700 transmits one or more control or data messages to a network controller on a return link of the first satellite after the handover operation (1305). In some implementations, the user terminal may measure a signal strength of a target beam of the second satellite (e.g., the non-LEO satellite), and may embed the measured signal strength in the one or more control or data messages transmitted to the SAN 150 using the return link of the first satellite (e.g., the LEO satellite). In addition, or in the alternative, the user terminal may transmit HARQ messages to the SAN 150 using the return link of the LEO satellite.

The user terminal 700 maintains the return link with the first satellite before and after the handover operation (1306). In this manner, the user terminal may use the return link of the LEO satellite to transmit control messages and data to the SAN 150 while the user terminal has a forward link connection with the non-LEO satellite.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, one aspect of the disclosure can include a non-transitory computer readable media embodying a method for time and frequency synchronization in non-geosynchronous satellite communication systems. The term "non-transitory" does not exclude any physical storage medium or memory and particularly does not exclude dynamic memory (e.g., conventional random access memory (RAM)) but rather excludes only the interpretation that the medium can be construed as a transitory propagating signal.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated. Accordingly, the disclosure is not limited to the illustrated examples and any means for performing the functionality described herein are included in aspects of the disclosure.

What is claimed is:

1. A method for switching forward link communications of a user terminal between first and second satellites, the method performed by the user terminal and comprising:
   receiving first data on a forward link of the first satellite;
   receiving time-division multiplexing (TDM) configuration information on the forward link of the first satellite, the TDM configuration information specifying a TDM transmission pattern for forward link communications to the user terminal from at least the first and second satellites;
   switching forward link communications of the user terminal from the first satellite to the second satellite during a handover operation;
   receiving second data on a forward link of the second satellite after the handover operation; and
   transmitting one or more control or data messages to a network controller on a return link of the first satellite after the handover operation.

2. The method of claim 1, wherein the one or more control or data messages comprise an acknowledgement of the second data received by the user terminal.

3. The method of claim 1, wherein the first satellite comprises a low-earth orbit (LEO) satellite, the second satellite is one of a medium-earth orbit (MEO) satellite or a geosynchronous orbit (GSO) satellite, and the one or more control or data messages comprise information pertaining to the handover operation from the first satellite to the second satellite.

4. The method of claim 1, wherein the first satellite comprises a low-earth orbit (LEO) satellite, the second satellite is one of a medium-earth orbit (MEO) satellite or a geosynchronous orbit (GSO) satellite, and the second satellite does not provide a return link for the user terminal.

5. The method of claim 1, wherein the specified TDM transmission pattern configures the user terminal to exchange data with the first satellite using a first communication frame and to receive data from the second satellite using a second communication frame.

6. The method of claim 1, wherein the specified TDM transmission pattern is based on one or more of latency requirements of data transmitted to the user terminal, a type or classification of data transmitted to the user terminal, and propagation delays of the first and second satellites.

7. The method of claim 1, wherein the specified TDM transmission pattern configures the user terminal to receive forward link communications from a low-earth orbit (LEO) satellite during a first portion of a TDM transmission period, to receive forward link communications from a medium-earth orbit (MEO) satellite during a second portion of a TDM transmission period, and to receive forward link communications from a geosynchronous orbit (GSO) satellite during a third portion of a TDM transmission period.

8. The method of claim 1, wherein the second data is transmitted from the second satellite using a concatenated code including a turbo code as an inner code and including a Bose-Chaudhuri-Hocquenghem (BCH) code as an outer code.

9. The method of claim 1, wherein the handover operation is triggered by a radio controller circuit (RRC) message transmitted to the user terminal using the forward link of the first satellite.

10. The method of claim 9, wherein the first satellite comprises a first low-earth orbit (LEO) satellite, the second satellite is one of a medium-earth orbit (MEO) satellite or a geosynchronous orbit (GSO) satellite, and the RRC message triggers a handover operation between the first satellite and a second LEO satellite.

11. The method of claim 1, further comprising:
   maintaining the return link between the first satellite and the user terminal before and after the handover operation.

12. A user terminal configured to switch forward link communications between first and second satellites, the user terminal comprising:
   one or more processors; and
   a memory storing instructions that, when executed by the one or more processors, cause the user terminal to:
      receive first data on a forward link of the first satellite;
      receive time-division multiplexing (TDM) configuration information on the forward link of the first satellite, the TDM configuration information specifying a TDM transmission pattern for forward link communications to the user terminal from at least the first and second satellites;
      switch forward link communications of the user terminal from the first satellite to the second satellite during a handover operation;
      receive second data on a forward link of the second satellite after the handover operation; and
      transmit one or more control or data messages to a network controller on a return link of the first satellite after the handover operation.

13. The user terminal of claim 12, wherein the one or more control or data messages comprise an acknowledgement of the second data received by the user terminal.

14. The user terminal of claim 12, wherein the first satellite comprises a low-earth orbit (LEO) satellite, the second satellite is one of a medium-earth orbit (MEO) satellite or a geosynchronous orbit (GSO) satellite, and the one or more control or data messages comprise information pertaining to the handover operation from the first satellite to the second satellite.

15. The user terminal of claim 12, wherein the first satellite comprises a low-earth orbit (LEO) satellite, the second satellite is one of a medium-earth orbit (MEO)

satellite or a geosynchronous orbit (GSO) satellite, and the second satellite does not provide a return link for the user terminal.

16. The user terminal of claim 12, wherein the specified TDM transmission pattern configures the user terminal to exchange data with the first satellite using a first communication frame and to receive data from the second satellite using a second communication frame.

17. The user terminal of claim 12, wherein the specified TDM transmission pattern is based on one or more of latency requirements of data transmitted to the user terminal, a type or classification of data transmitted to the user terminal, and propagation delays of the first and second satellites.

18. The user terminal of claim 12, wherein the specified TDM transmission pattern configures the user terminal to receive forward link communications from a low-earth orbit (LEO) satellite during a first portion of a TDM transmission period, to receive forward link communications from a medium-earth orbit (MEO) satellite during a second portion of a TDM transmission period, and to receive forward link communications from a geosynchronous orbit (GSO) satellite during a third portion of a TDM transmission period.

19. The user terminal of claim 12, wherein the second data is transmitted from the second satellite using a concatenated code including a turbo code as an inner code and including a Bose-Chaudhuri-Hocquenghem (BCH) code as an outer code.

20. The user terminal of claim 12, wherein the handover operation is triggered by a radio controller circuit (RRC) message transmitted to the user terminal using the forward link of the first satellite.

21. The user terminal of claim 20, wherein the first satellite comprises a first low-earth orbit (LEO) satellite, the second satellite is one of a medium-earth orbit (MEO) satellite or a geosynchronous orbit (GSO) satellite, and the RRC message triggers a handover operation between the first satellite and a second LEO satellite.

22. The user terminal of claim 12, wherein execution of the instructions causes the user terminal to further:
maintain the return link between the first satellite and the user terminal before and after the handover operation.

23. A non-transitory computer-readable medium comprising instructions that, when executed by one or more processors of a user terminal, cause the user terminal to switch forward link communications between first and second satellites by performing operations including:
receiving first data on a forward link of the first satellite;
receiving time-division multiplexing (TDM) configuration information on the forward link of the first satellite, the TDM configuration information specifying a TDM transmission pattern for forward link communications to the user terminal from at least the first and second satellites;
switching forward link communications of the user terminal from the first satellite to the second satellite during a handover operation;
receiving second data on a forward link of the second satellite after the handover operation; and
transmitting one or more control or data messages to a network controller on a return link of the first satellite after the handover operation.

24. The non-transitory computer-readable medium of claim 23, wherein the specified TDM transmission pattern configures the user terminal to exchange data with the first satellite using a first communication frame and to receive data from the second satellite using a second communication frame.

25. The non-transitory computer-readable medium of claim 23, wherein the specified TDM transmission pattern is based on one or more of latency requirements of data transmitted to the user terminal, a type or classification of data transmitted to the user terminal, and propagation delays of the first and second satellites.

26. The non-transitory computer-readable medium of claim 23, wherein the specified TDM transmission pattern configures the user terminal to receive forward link communications from a low-earth orbit (LEO) satellite during a first portion of a TDM transmission period, to receive forward link communications from a medium-earth orbit (MEO) satellite during a second portion of a TDM transmission period, and to receive forward link communications from a geosynchronous orbit (GSO) satellite during a third portion of a TDM transmission period.

27. The non-transitory computer-readable medium of claim 23, wherein the handover operation is triggered by a radio controller circuit (RRC) message transmitted to the user terminal using the forward link of the first satellite.

28. The non-transitory computer-readable medium of claim 27, wherein the first satellite comprises a first low-earth orbit (LEO) satellite, the second satellite is one of a medium-earth orbit (MEO) satellite or a geosynchronous orbit (GSO) satellite, and the RRC message triggers a handover operation between the first satellite and a second LEO satellite.

29. The non-transitory computer-readable medium of claim 23, wherein execution of the instructions causes the user terminal to perform operations further comprising:
maintaining the return link between the first satellite and the user terminal before and after the handover operation.

30. An apparatus configured to switch forward link communications between first and second satellites, the apparatus comprising:
means for receiving first data on a forward link of the first satellite;
means for receiving time-division multiplexing (TDM) configuration information on the forward link of the first satellite, the TDM configuration information specifying a TDM transmission pattern for forward link communications to the user terminal from at least the first and second satellites;
means for switching forward link communications of the user terminal from the first satellite to the second satellite during a handover operation;
means for receiving second data on a forward link of the second satellite after the handover operation; and
means for transmitting one or more control or data messages to a network controller on a return link of the first satellite after the handover operation.

* * * * *